United States Patent
He et al.

(10) Patent No.: US 9,767,919 B1
(45) Date of Patent: Sep. 19, 2017

(54) SYSTEMS AND METHODS FOR TESTING A SEMICONDUCTOR MEMORY DEVICE HAVING A REFERENCE MEMORY ARRAY

(71) Applicant: Micron Technology, Inc., Boise, ID (US)

(72) Inventors: Yuan He, Hachioji (JP); Yutaka Ito, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/130,789

(22) Filed: Apr. 15, 2016

(51) Int. Cl.
| G11C 29/38 | (2006.01) |
|---|---|
| G11C 29/44 | (2006.01) |
| G11C 29/12 | (2006.01) |
| G11C 29/18 | (2006.01) |

(52) U.S. Cl.
CPC ........ *G11C 29/38* (2013.01); *G11C 29/12005* (2013.01); *G11C 29/18* (2013.01); *G11C 29/44* (2013.01); *G11C 2029/1802* (2013.01)

(58) Field of Classification Search
CPC ... G11C 29/38; G11C 29/12005; G11C 29/18; G11C 29/44; G11C 2029/1802
See application file for complete search history.

(56) References Cited

U.S. PATENT DOCUMENTS

| 6,650,584 B2 * | 11/2003 | Cowles | G11C 11/4074 |
| | | | 365/201 |
| 6,721,198 B2 * | 4/2004 | Kang | G11C 11/22 |
| | | | 365/145 |
| 6,965,531 B2 | 11/2005 | Mine | |
| 7,586,804 B2 * | 9/2009 | Hwang | G11C 7/1078 |
| | | | 365/189.17 |
| 7,768,814 B2 | 8/2010 | Argawal et al. | |
| 7,869,274 B2 * | 1/2011 | Fujita | G11C 11/404 |
| | | | 365/185.05 |
| 8,514,610 B2 | 8/2013 | Shin et al. | |
| 8,619,484 B2 * | 12/2013 | Lim | G11C 7/12 |
| | | | 365/207 |
| 8,797,816 B2 | 8/2014 | Jo | |
| 2011/0211410 A1 * | 9/2011 | Kim | G11C 11/4097 |
| | | | 365/210.1 |

OTHER PUBLICATIONS

Lim, et al., "A 1.2V 23nm 6F 4Gb DDR3 SDRAM with Local-Bitline Sense Amplifier, Hybrid LIO Sense Amplifier and Dummy-Less Array Architecture", IEEE International Solid-State Circuits Conference, Feb. 2012, 3 pgs.

* cited by examiner

*Primary Examiner* — Vanthu Nguyen
(74) *Attorney, Agent, or Firm* — Dorsey & Whitney LLP

(57) ABSTRACT

Semiconductor memory testing devices and methods are disclosed. In one respect, a device is disclosed that includes a first memory cell array having a first bit-line and a plurality of first memory cells connected to the first bit-line; a second memory cell array having a second bit-line and a plurality of second memory cells connected to the second bit-line, the number of second memory cells being smaller than that of the first memory cells; a sense amplifier connected to the first bit-line and a first end of the second bit-line; a word decoder configured to operate the second memory cells responsive to a first test signal; and a transistor coupled to a second end of the second bit-line and operated by a second test signal.

14 Claims, 26 Drawing Sheets

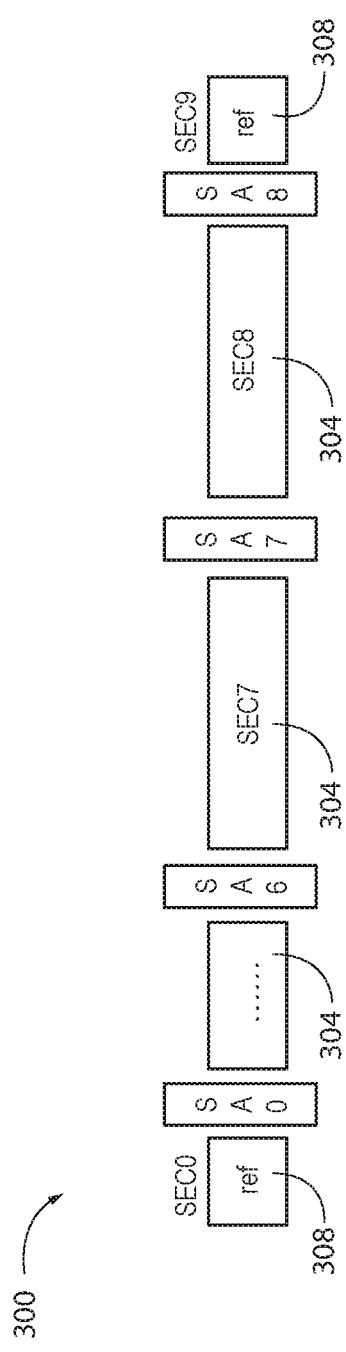
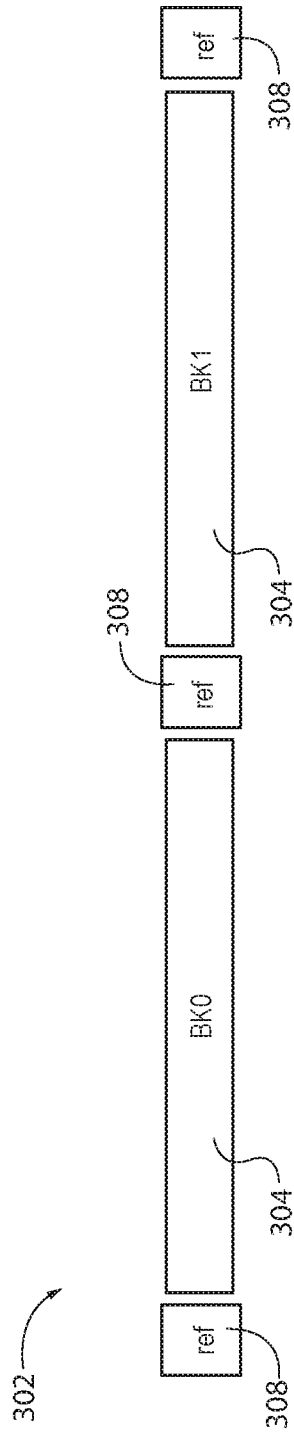
FIG. 3A
FIG. 3B

SYSTEMS AND METHODS FOR TESTING A SEMICONDUCTOR MEMORY DEVICE HAVING A REFERENCE MEMORY ARRAY

TECHNICAL FIELD

Semiconductor memory testing devices and methods are disclosed.

BACKGROUND

Memory devices that employ an open bit-line architecture can make use of smaller memory cell sizes when compared to that of folded bit-line architectures. In some current examples, an open bit-line architecture may use a 6F2-cell, whereas a 8F2-cell is typically used in a folded bit-line architecture. Drawbacks of the open bit-line architecture include large area penalties in the edge sections, which sections have half of the bit-lines tied to reference voltage (~Vary/2) as a dummy area for sensing noise immunity. Also, bit-line lengths generally tend to be extended to lengths such as 832-bit or 1K-bit because die size reduction is desirable with improvements in area efficiency and Cd/Cs ratios. However, extended bit-line may have enlarged edge sections, which limits die size reduction because of the accompanying dummy area increase. Operational voltage tends to become lower while, at the same time, process evolution has developed decreased bit-line capacitance and smaller Cd/Cs ratio. In open bit-line scheme, an extended bit-line is not always compatible with smaller die sizes. Typically, there is an optimal bit line length for a given die size. Additionally, under nanofabrication, a memory device's operational voltage tends to be lower due to consideration of transistor reliability. In some instances, sense amplifier imbalances tend not to be improved due to somewhat increased process variation.

BRIEF DESCRIPTION OF THE DRAWINGS

FIGS. 3A-B are schematic illustrations of various example arrangements for storage and reference arrays in accordance with the present disclosure.

DETAILED DESCRIPTION

The present disclosure is directed to semiconductor memory testing devices and methods. A semiconductor memory in accordance with this disclosure may include a memory array section that functions as a reference section, rather than a data storage section. Specifically, the reference section functions to support a balanced operation of the sense amplifiers associated with memory device and does not generally store data. The reference memory array is generally smaller than other sections used for data storage. When the memory device enables word-lines in a storage array adjacent to the reference array, the reference array balances the capacitance of storage array bit lines through a group of activated word-lines in the reference array. Present embodiments are directed to testing methods that determine which word-lines are to be included and which are not to be included in the activated word-line group of the reference array. Additional embodiments are directed to further improvements that use dummy words lines in connection with memory access operations and pre-charge operations.

System Overview

Figure 1A:
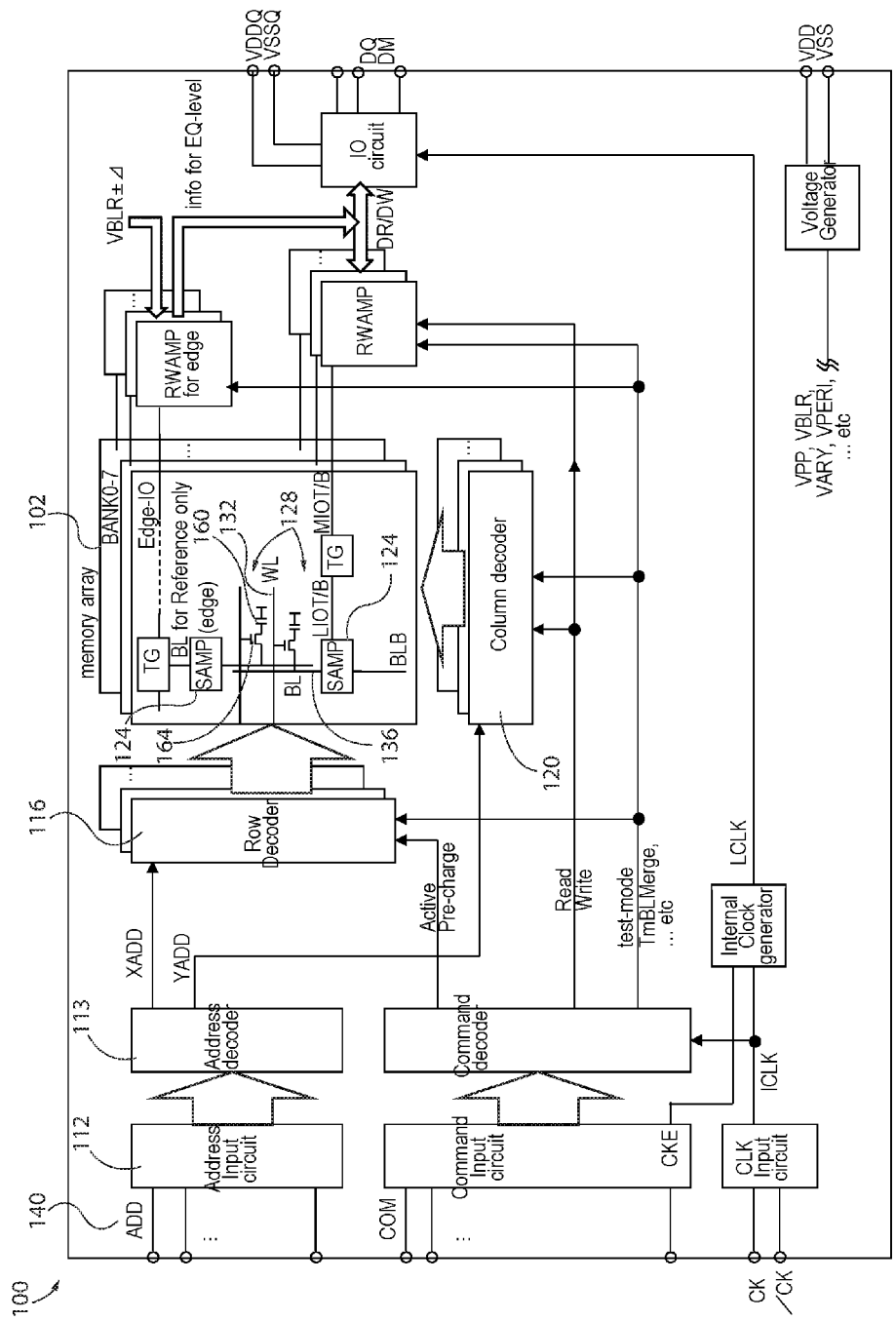
FIGS. 1A-C are schematic illustrations of an example memory device in accordance with the present disclosure.
Figure 1B:
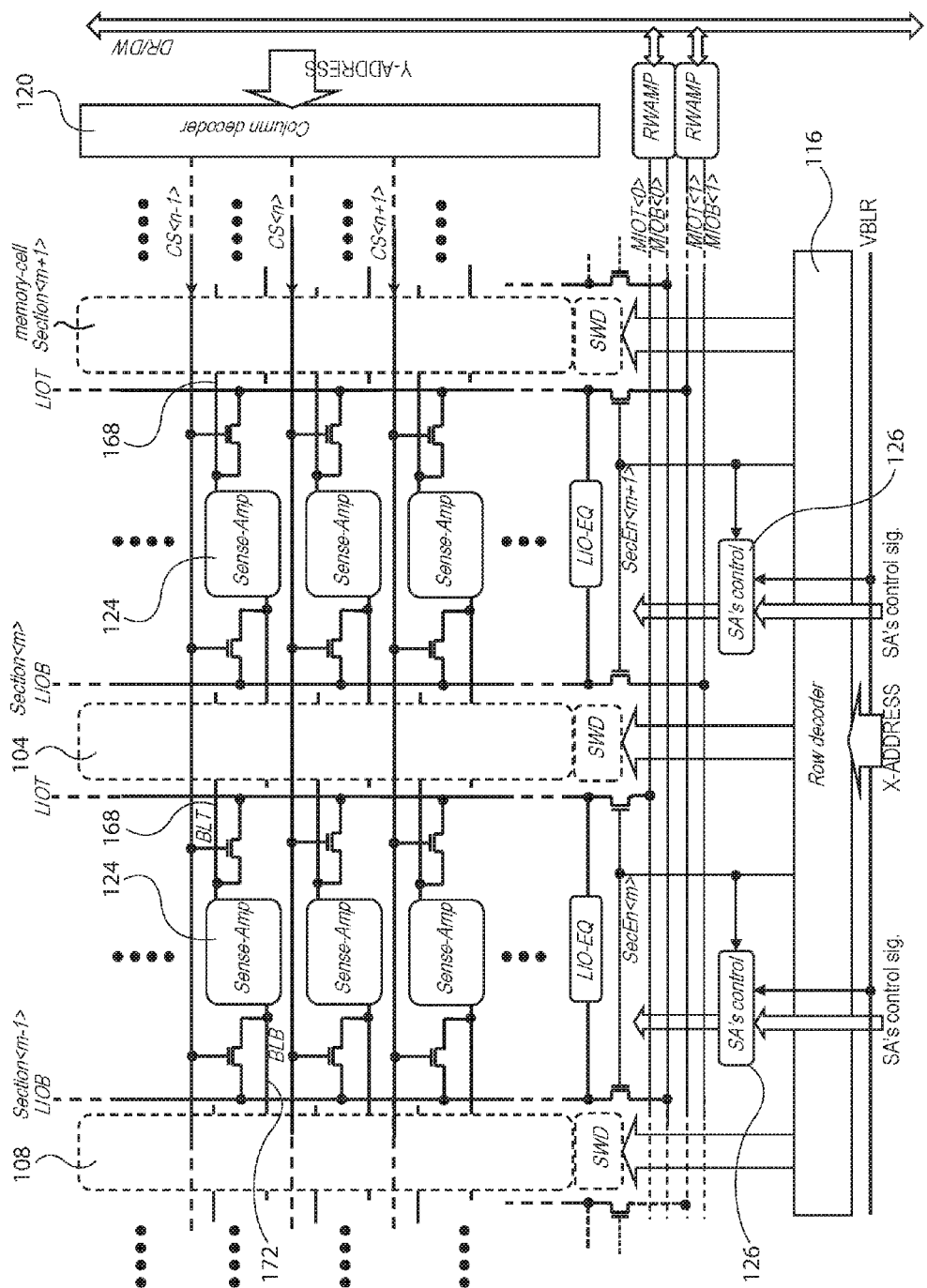
Figure 1C:
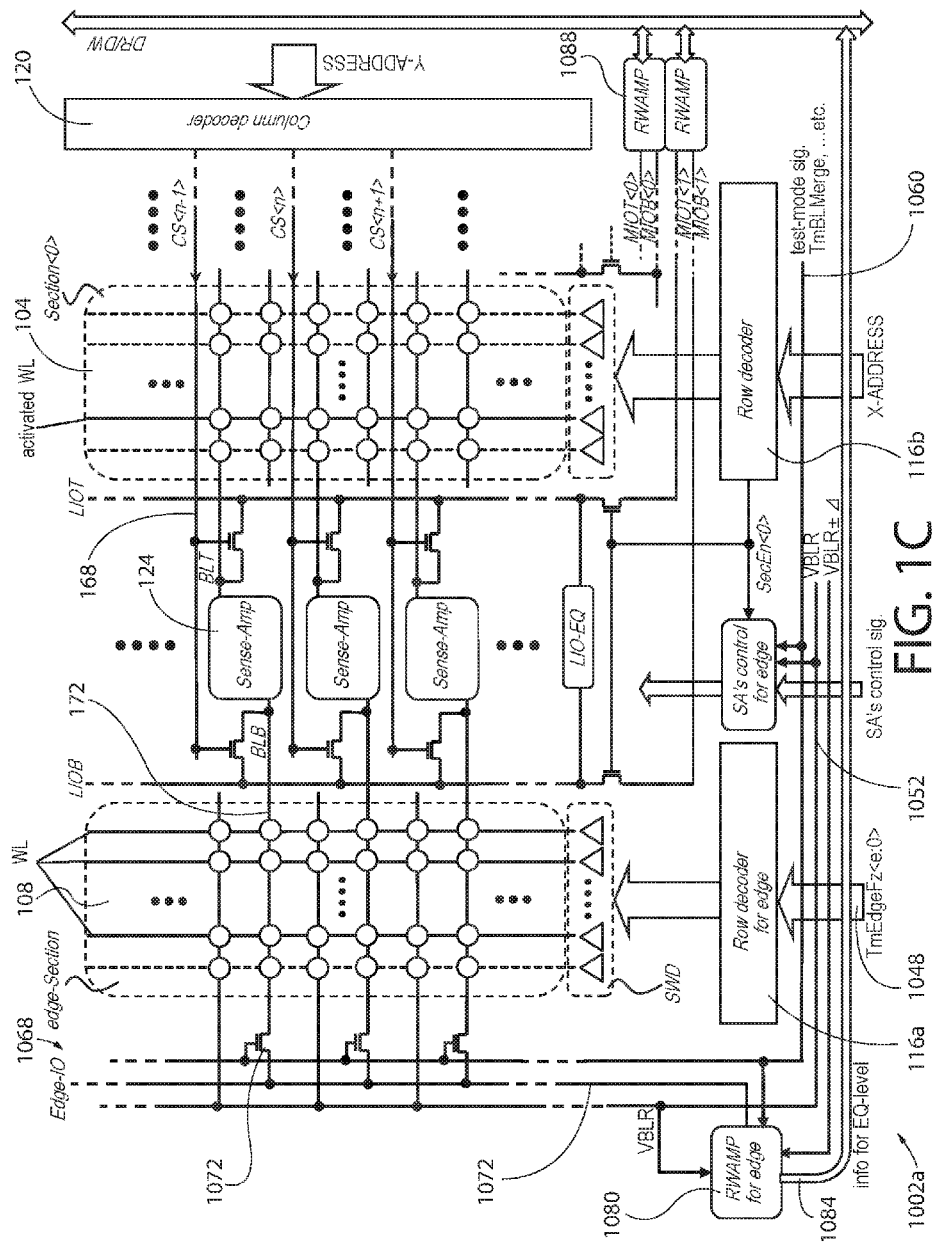

FIGS. 1A-C illustrates an example memory device 100 in accordance with the present disclosure. A memory device 100 may include any of a number of suitable memory devices, such as a Dynamic Random Access Memory (DRAM) device. FIG. 1A is a schematic of the example memory device 100 that illustrates a number of memory banks, as well as various control circuits associated with the memory banks. FIG. 1B is an additional schematic of the example memory device 100 that includes a number of memory arrays within a particular memory bank. FIG. 1C is an additional schematic of the example memory device 100 that shows individual memory cells within a number of memory arrays.

Generally, a memory device 100 in accordance with the present disclosure may include hundreds of separate memory arrays. FIG. 1A shows a number of memory banks 102, which include a number of memory arrays. FIGS. 1B-C show at least two memory arrays 104, 108 by way of example and not limitation. The memory banks 102 (and thus the memory arrays 104, 108) are associated with an address input circuit 112, an address decoder 113, a word decoder 116 (also referred to as a row decoder), a bit decoder 120 (also referred to as a column decoder), and with a plurality of shared sense amplifiers 124. FIGS. 1B-C also shows sense amplifier controller 126, which are described in greater detail below in connection with FIGS. 16A-B. The memory device 100 of FIG. 1C includes a first memory array arranged as a storage array 104 and a second memory array arranged as a reference array 108. A storage array 104 is generally configured to store data that is accessed through the operation of the address input circuit 112, word decoder 116, and bit decoder 120. As described in greater detail below, the reference array 108 is generally not configured to store data, but rather is configured to be selectively activated to support a balanced operation of the sense amplifiers 124. FIG. 1C also shows LIO-EQ circuits 127, which are described in greater detail below in connection with FIGS. 17A-B.

Each memory array 104, 108 includes a plurality of memory cells 128 coupled to a plurality of intersecting word-lines 132 and bit-lines 136. Each memory cell 128 is associated with one of the word-lines 132 and with one of the bit-lines 136. Thus, each memory cell 128 has an address 140 that uniquely identifies its location in the memory device 100 based on the intersection of the word-line 132 and the bit-line 136 associated with the particular memory cell 128. Each memory cell 128 is generally configured to store a bit of data that is readable and writable through the operation memory device 100. In addition, the memory arrays 104, 108 may include a plurality of dummy cells coupled to a dummy word-line and to the bit-lines 136. Each dummy cell is uniquely identified by the intersection of the dummy word-line and a bit-line 136. The dummy cells are generally not configured to store data, but rather to be addressed to add capacitance to a bit-line 136 so as to balance the load seen by the sense amplifiers 124. These and other aspects of memory cells and dummy cells in accordance with the present disclosure are described in greater detail below. FIGS. 1A-C shows a number of word-lines and bit lines by way of example and not limitation. An exemplary memory device 100 may comprise hundreds of word-lines and hundreds of bit-lines and any given number of dummy word-lines.

FIG. 1A includes illustrations of example memory cells 128. The memory cells of the various memory arrays and/or dummy cells (described in greater detail below) may have the same configuration as the example memory cells 128 shown in FIG. 1A. The example memory cell 128 includes a storage device capable of holding a charge, such as a capacitor 160, and an access transistor 164 configured as a switch. The example memory cell 128 may hold a single bit of data through the presence or absence of a charge on the capacitor 160. When arranged as part of a dummy cell, the capacitor 160 may be set to a predetermined state, such as a discharged state. The access transistor 164 has a respective gate coupled to a word-line 132 associated with the memory cell 128. When the access transistor 164 is activated, the capacitor 160 in the memory cell 128 becomes electrically coupled to the bit-line 136 associated with the memory cell 128. The charge on the capacitor 160, if any, may then pass to the bit-line 136 to be read through the operation of a sense amplifier 124.

The sense amplifiers 124 may be generally configured with two sides, each of which is coupled to a particular segment of a bit-line 136. The memory arrays 104, 108 illustrated in FIGS. 1A-C are implemented using an "open" bit-line configuration. That is, for each sense amplifier 124, one of the bit-line segments coupled to the sense amplifier 124 is located within the first memory array 104, while the other bit-line segment coupled to the sense amplifier 124 is located within the second memory array 108. The memory arrays 104, 108 may also be implemented using a variety of alternative configurations, such as "folded" bit-line configuration, in which both bit-lines segments coupled to each sense amplifier are located within the same memory array. In one embodiment, the word-lines 132, the dummy word-lines, and the bit-lines 136 are fabricated as metal lines on an integrated circuit.

A sense amplifier 124 may be generally configured to sense the content of a memory cell 128 by amplifying and outputting a voltage difference that is present on a pair of bit-lines segments to which the sense amplifier 124 is coupled. Here, the sense amplifier 124 may be coupled to two bit-lines segments that are associated with adjacent memory arrays. By way of example, FIGS. 1B-C shows sense amplifiers 124 that are coupled to a first bit-line segment 168 associated with the first memory array 104. The sense amplifiers 124 are additionally coupled to a second bit-line segment 172 associated with the second memory array 108. During a read operation or other memory access operation for a desired memory cell 128, a sense amplifiers 124 may detect the presence or absence of a charge on the capacitor 160 in the desired memory cell 128 by comparing the voltage on the two bit-line segments 168, 172 coupled to the sense amplifier 124.

To detect the state of the capacitor 160 in a particular memory cell 128, the memory cell 128 is selected, or addressed. The address 140 for the desired memory cell 128 is provided to the address input circuit 112, which through the address decoder 113 provides signals representing the address 140 to the word decoder 116 and to the bit decoder 120. When a particular memory cell 128 is addressed, the word decoder 116 and the bit decoder 120 pre-charge a first bit-line segment 168 to which the memory cell 128 is coupled to a predetermined voltage level, referred to as Vary/2. This bit-line segment 168 is coupled to a sense amplifier 124 that, in turn, is coupled to a second bit-line segment 172 in an adjacent memory array. This second bit-line segment 168 is additionally pre-charged by the word decoder 116 and the bit decoder 120 as part of accessing the memory cell 128. Once the bit-line segments 168, 172 are pre-charged, the bit decoder 120 applies a predetermined voltage to the word-line 132 coupled to the memory cell 128*a*, which activates the access transistors 164 in each of the memory cells 128 coupled to the selected word-line 132.

When the access transistor 164 in the addressed memory cell 128 is activated, the capacitor 160 in the memory cell 128 becomes electrically coupled to the first bit-line segment 168. If the capacitor 160 in the addressed memory cell 128 is charged when the access transistor 164 is activated, then the capacitor 160 discharges onto the first bit-line segment 168, and the voltage on the first bit-line segment 168 changes from Vary/2. On the other hand, if the capacitor 160 in the addressed memory cell 128 is not charged when the access transistor 164 is activated, then the voltage on the first bit-line segment 168 remains at Vary/2. As mentioned, the first bit-line segment 168 is coupled to a sense amplifier 124 that, in turn, is coupled to a second bit-line segment 172 in an adjacent memory array. The memory cells coupled to the second bit-line segment 172 are not accessed when the addressed memory cell 128 is accessed. Here, the second bit-line segment 172 remains at the pre-charge voltage level Vary/2. Thus, the state of the capacitor 160 in the desired memory cell 128 can be detected by comparing the voltage on the first bit-line segment 168 with the measured voltage on the second bit-line segment 172.

For example, if the capacitor 160 in the memory cell 128 is charged, then the voltage on the first bit-line segment 168 will change from Vary/2 when the access transistor 164 in the cell 128 is activated. Thus, a voltage differential will exist when the voltage on the first bit-line segment 168 and the voltage on the second bit-line 172 are compared. On the other hand, if the capacitor 160 in the memory cell 128 is not charged, then the voltage on the first bit-line segment 168 will remain at Vary/2 when the access transistor 164 in the memory cell 128 is activated. Thus, no voltage differential will exist when the voltage on the first bit-line segment 168 and the voltage on the second bit-line 172 are compared. Accordingly, the state of the capacitor 160 in the memory cell 128 can be determined by detecting the presence or the absence of a voltage differential between the first bit-line segment 172 and the second bit-line segment 168.

Figure 2:
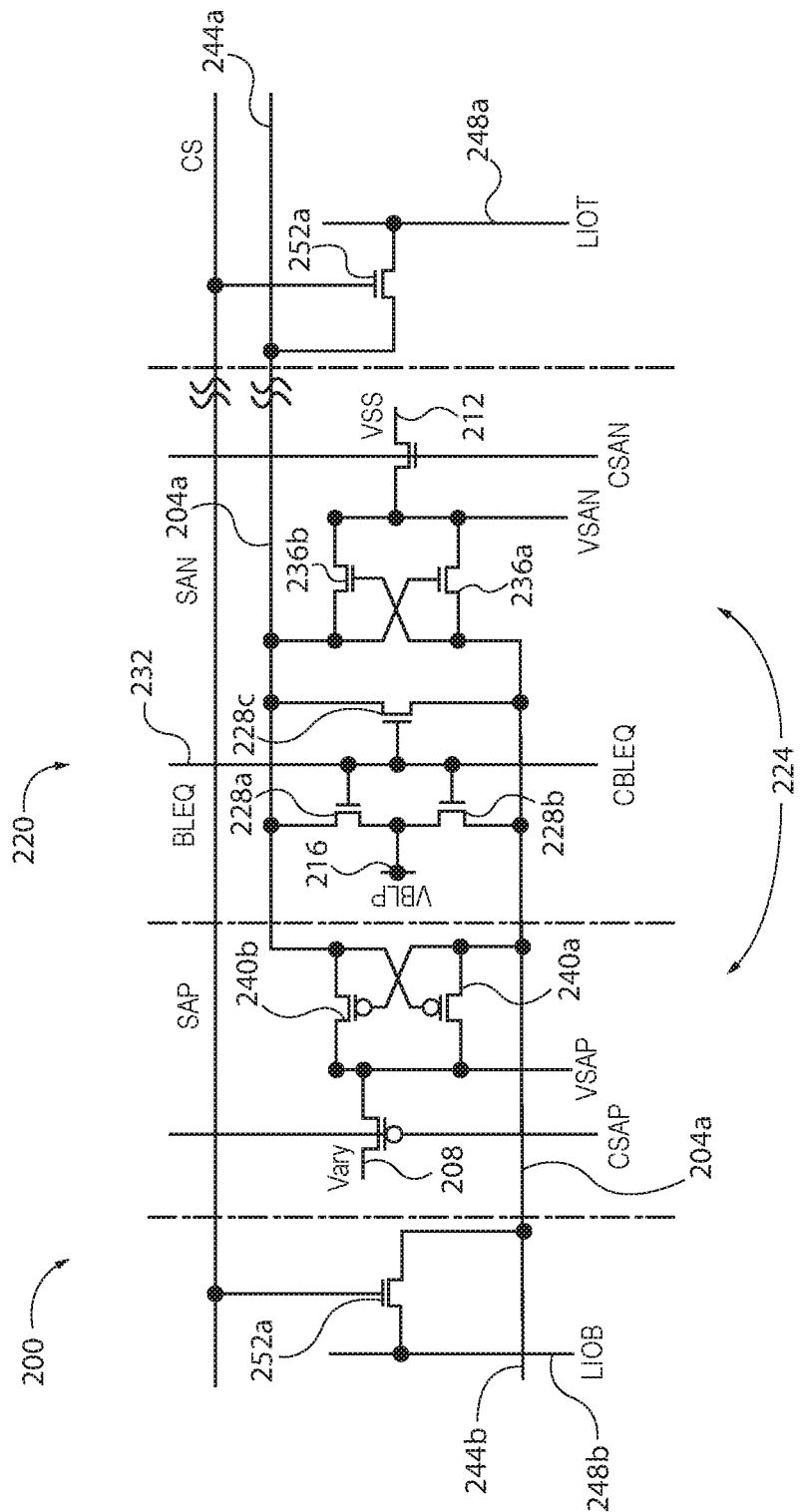
FIG. 2 is a schematic illustration of a sense amplifier in accordance with the present disclosure.

FIG. 2 illustrates a sense amplifier 200 embodiment. The sense amplifier 200 is coupled to a pair of bit-lines, referred to as a first bit-line 204a and a second bit-line 204b. In one example, the sense amplifiers 124 illustrated in FIG. 1 may be implemented using the sense amplifier 200 shown in FIG. 2. In this regard, the first bit-line 204a may correspond to the first bit-line segment 168, and the second bit-line 204b may correspond to the second bit segment 172. Referring to FIG. 2, the sense amplifier 200 may receive a power supply voltage, Vary, via a power supply line 208. The sense amplifier 200 may be connected to a low voltage such as ground through a VSS connection line 212. The sense amplifier 200 additionally receive an equalization voltage, VBLP, via an equalization voltage line 216. The sense amplifier 200 may include a first group of transistors 220 that are connected to the bit-lines 204a-b and to the equalization voltage line 216. The sense amplifier 200 may additionally include a second group of transistors 224 that are connected to the bit-lines 204a-b and to the power supply 208 and ground 212 connections.

The first group of transistors 220 are generally configured to pre-charge the bit-lines 204a-b in preparation for a read operation or other memory access operation. In the first group of transistors 220, the first bit-line 204a is coupled to the drain a first n-channel device 228a and to the drain of a second n-channel device 228b. The second bit-line 204b is coupled to the source of a third n-channel device 228c and to the source of the second n-channel device 228b. The source of both the first n-channel device 228a and the source of the third re-channel 228c are coupled to the equalization voltage line 216. The gates of the first re-channel device 228a, the second n-channel device 228b, and the third n-channel device 228c are each coupled to an equalization control line 232.

The second group of transistors 224 may be generally configured to sense a voltage difference between the bit-lines 204a-b. In the second group of transistors 220, the first bit-line 204a is coupled to the gate of a first n-channel device 236a and to the gate of a first p-channel device 240a. Similarly, the second bit-line 204b is coupled to the gate of a second n-channel device 236b and to the gate of a second p-channel device 240b. In addition, the first bit-line 204a is coupled to the drain of the second n-channel device 236b and to the drain of the second p-channel device 240b. Likewise, the second bit-line 204b is coupled to the drain of the first n-channel device 236a and to the drain of the first p-channel device 240a. The sources of the two n-channel devices 236a, 236b are both coupled to ground. The sources of the two p-channel devices 240a, 240b are both coupled to the power supply line 208.

When the sense amplifier 200 is sensing the state of a memory cell, the bit-lines 204a, 204b are pre-charged to a predetermined voltage, Vary/2, through the operation of the first group of transistors 220. Word-lines are then asserted so as to couple memory cells to the bit-lines 204a, 204b in preparation for amplification by the second group of transistors 220. If the sense amplifier 200 is sensing the state of a memory cell that is coupled to the first bit-line 204a and that has a charged capacitor, then the capacitor discharges onto the first bit-line 204a when the memory cell is addressed. The discharge of the capacitor onto the first bit-line 204a causes a slight increase in voltage on the first bit-line 204a. On the other hand, if the capacitor in the addressed memory cell is not charged, then the voltage on the first bit-line 204a remains at Vary/2. The sense amplifier 200 senses the slight increase in voltage on the first bit-line 204a (or absence thereof) by comparing the voltage on the first bit-line 204a with the voltage on the second bit-line 204b. Thus, the sense amplifier 200 senses the state of the capacitor in the desired memory cell. The sense amplifier 200 is configured to detect a slight voltage differential existing between two input voltage signals received via the bit-lines 204a, 204b. Furthermore, the sense amplifier 200 is configured to amplify the slight voltage differential to a value of about Vary and to provide two output voltage signals via the bit-lines 204a, 204b having the amplified voltage differential.

As an example, if the sense amplifier 200 is sensing the state of a memory cell that is coupled to the first bit-line 204a and that has a charged capacitor, then the discharge of the capacitor onto the first bit-line 204a causes a slight increase in voltage on the first bit-line 204a. A typical value for the slight increase in voltage on the first bit-line 204a caused by the discharge of the capacitor is about 50 mV. The sense amplifier is configured to detect the voltage differential of about 50 mV existing between the first bit-line 204a and the second bit-line 204b. If the value of Vary/2 is about 1.8 V, then the sense amplifier 200 amplifies the 50 mV voltage differential to a voltage differential of about 1.8 V. The sense amplifier 200 provides two output voltage signals via the bit-lines 204a, 204b with a voltage differential of about 1.8 V existing between them.

The bit-lines 204a-b associated with the sense amplifier 200 may include a global portion (MIO) and a local portion (LIO). For example, the first bit-line 204a may include a global bit-line 244a that connections the sense amplifier 200 to the data readout circuits that are coupled to or otherwise associated with the memory device of which the sense amplifier 200 is a component. The first bit-line 204a may also include one or more local bit-lines 248a that are coupled to the global bit-line 244a through an access transistor 252a. The local bit-line 248a provides access to an individual memory cell of the memory device. Data is write in and read out of the memory device by being written across the global bit-line 244a and into and out of an individual memory cell through the access transistor 252a and other components of the memory device. The first global bit-line 244a, the first local bit 248a and the first access transistor 252a shown in FIG. 2 may be associated with a first memory array adjacent to the sense amplifier 200. FIG. 2 additionally shows a second global bit-line 244b, a second local bit 248b and a second access transistor 252a that may be associated with a second memory array adjacent to the sense amplifier 200.

Reference Arrays

A memory device in accordance with the present disclosure may include one or more reference arrays that are generally not configured to store data, but rather configured to be selectively activated to support a balanced operation of sense amplifiers associated the memory device. The reference array may replace conventional edge arrays that are larger and that include memory cells used for data storage. Typically, half of the memory cells in a conventional edge array are used to store data and thus are connected to sense amplifiers that are disposed between the edge array and an adjacent memory array. The remaining half of the memory cells in a conventional edge array are typically unused and may be tied high by being coupled to a power supply voltage. In a conventional arrangement, the edge array is typically the same size as other arrays in the memory device. Thus, the bit-line segments in the edge array are typically the same size as the bit-line segment in the array adjacent to the edge array. A conventional edge array may either be the activated side or the reference side in a read operation or other memory access operation. In either case, the capacitance on either side of the sense amplifier typically balance because the bit-line segments are the same length.

In contrast to a conventional edge array, an edge array in accordance with the present disclosure may be smaller and may only be used as a reference side in a read operation or other memory access operation. More specifically, as shown in FIG. 1, a storage array 104 may contain a greater number of word-lines 132 and thus may be generally wider than the reference array 108. By way of illustration, FIG. 1 shows a fraction of the number of words lines 132 that may be included in a storage array 104. Generally, a storage array 104 in accordance with the present disclosure may include hundreds or thousands of word-lines 132. In contrast, reference array 108 in accordance with the present disclosure may include a smaller number of word-lines 132. In some embodiments, a reference array 108 may include as few as three or four word-lines 132. In other embodiments, a reference array 108 may include between three and fifty word-lines. FIGS. 3A-B show various example arrangements for the storage 304 and reference arrays 308 in accordance with the present disclosure. The storage 304 and references arrays 308 may correspond to the storage 104 and reference arrays 108 shown in FIG. 1. As shown in FIG. 3A, a reference array 308 may be arranged at an edge of a memory device 300. As shown in FIG. 3B, a reference array 308 may be an edge of a memory bank associated with a memory device 302.

Referring again to FIG. 1, the example memory device 100 shown therein includes a reference array 108 provided in association with a storage array 104. The reference array 108 includes a number of memory cells 128 that may be activated through word-lines 132 to which they are coupled. In accordance with present embodiments, the memory cells 128 of the reference array 108 may not generally be used to store data. Rather, the memory cells 128 in the reference array 108 may be activated in groups at least during a read operation or other memory access operation in order to support a balanced operation of the sense amplifiers 124 that are used to read out data as described above. More specifically, the memory cells 128 in the reference array 108 are activated to add capacitance to the bit-line segment 172 such that this added capacitance is seen by the sense amplifier 124a-b when the sense amplifier 124 amplifies the voltage difference on the bit-line segments 168, 172. As used herein, certain word-lines 132 are "always activated" in the sense that they are always activated when a memory access operation occurs. In one implementation, the always activated word-lines 132 are associated with the activated memory cells 128 in the reference array 108 and are asserted at all times asserted. Alternatively, the always activated word-lines 132 may be associated with the activated memory cells 128 in the reference array 108 may be asserted just during the memory access operation in order to conserve power.

The number of word-lines 132 in the reference array that are activated and thus the amount of capacitance added to the second bit-line segment 172 may be chosen to balance the capacitance present on the first bit-line segment 168. The amount of capacitance that may be added to balance the capacitance present on the first bit-line segment 168 may be determined by a number of considerations including signal amounts that will typically be available at the sense amplifier 124. In order to more fully describe the process, reference is made to Equation (1), which generally governs the amount of voltage that is available to produce signal at the sense amplifier 124 during a read operation or other memory operation.

$$V_{sig} = \frac{V_{ary}}{2} \times \frac{1}{Cd/Cs + 1} \geq V_{limit} \quad (1)$$

In Equation (1), Vsig is the voltage available for the operation the sense amplifier; Vary is the power supply voltage of memory array; Cd is capacitance of the bit-line segment; Cs is the capacitance of a memory cell; and Vlimit is the needed signal amount for proper operation of the sense amplifier. As can be seen from Equation (1), the amount of voltage available for the operation the sense amplifier (Vsig) is inversely related to the ratio of the capacitance of the bit-line segment (Cd) to the ratio of the memory cell (Cs). As the Cd/Cs ratio increases, the amount of voltage available for the operation the sense amplifier decreases. As the Cd/Cs ratio decreases, the amount of voltage available for the operation the sense amplifier increases. Thus, the Cd/Cs ratio tends to be smaller to keep an amount of the signal available for the sense amplifier's sensing operation. In some larger nanometer processes, Vary is typically around approximately 2V. Here, the Cd/Cs ratio is around approximately 5. In some smaller nanometer processes, Vary can be around approximately 1V. Here, the Cd/Cs ratio can be less than or around approximately 2. By way of example, Equation (2) sets forth the Cd/Cs ratio for this smaller nanometer process.

$$Cd/Cs=2 \quad (2)$$

As mentioned in connection with FIG. 1, the number of word-lines 132 in the reference array that are activated and thus the amount of capacitance added to the second bit-line segment 172 may be chosen to balance the capacitance present on the first bit-line segment 168. The Cd/Cs ratio for a given memory device may be used to gauge the amount of capacitance that is present on a first bit-line segment 168. During a memory read or other memory access operation such as for the example memory cell 128a, the amount of capacitance present on the first bit-line segment 168 includes the capacitance of the first bit-line segment 168 plus the capacitance of the activated memory cell 128a. Thus, using the notation introduced above, the capacitance of a bit-line segment 168 during a memory read operation is given by the quantity (Cd+Cs). Given a known Cd/Cs ratio, this quantity may be manipulated to express the capacitance of a bit-line segment 168 in terms of a number of memory cell capacitances. Continuing with the smaller nanometer example above, the capacitance of a bit-line segment 168 as given by the quantity (Cd+Cs) can be expressed as follows:

$$Cd+Cs=3C \tag{3}$$

Because the capacitance of the bit-line segment 168 during a memory read operation (Cd+Cs) is expressed in terms of a number of memory cell capacitances (Cs), Equation (3) may be used to at least estimate the number word-lines 132 to activate in the storage array 104 so as to provide a balanced operation of the sense amplifier 124a-b. Specifically, Equation (3) estimates the capacitance of the bit-line segment 168 during a memory read operation to be approximately three times the capacitance an individual memory cell 128. Thus, in order to balance the capacitance on the storage array bit-line segment 168, the capacitance on the reference array bit-line segment 172 should be approximately equal to the capacitance of three individual memory cells 128. As discussed above, a reference array 108 in accordance with the present disclosure may include short bit-line segment lengths as the reference array 108 is typically somewhat narrow. Because the reference array 108 has a short bit-line segment 172, the capacitance may be small enough to be ignored or minimized in the balancing calculation. Because the capacitance of the bit-line segment 172 may be ignored, the proper balancing capacitance may be added to the bit-line segment by just asserting an appropriate number of word-lines in the reference array 172. Thus, following Equation (3), a proper balancing capacitance on the reference array bit-line segment 172 may be achieved by activating three word-lines 132 in the reference array 172. This process is described in greater detail in connection with FIG. 4.

Figure 4:
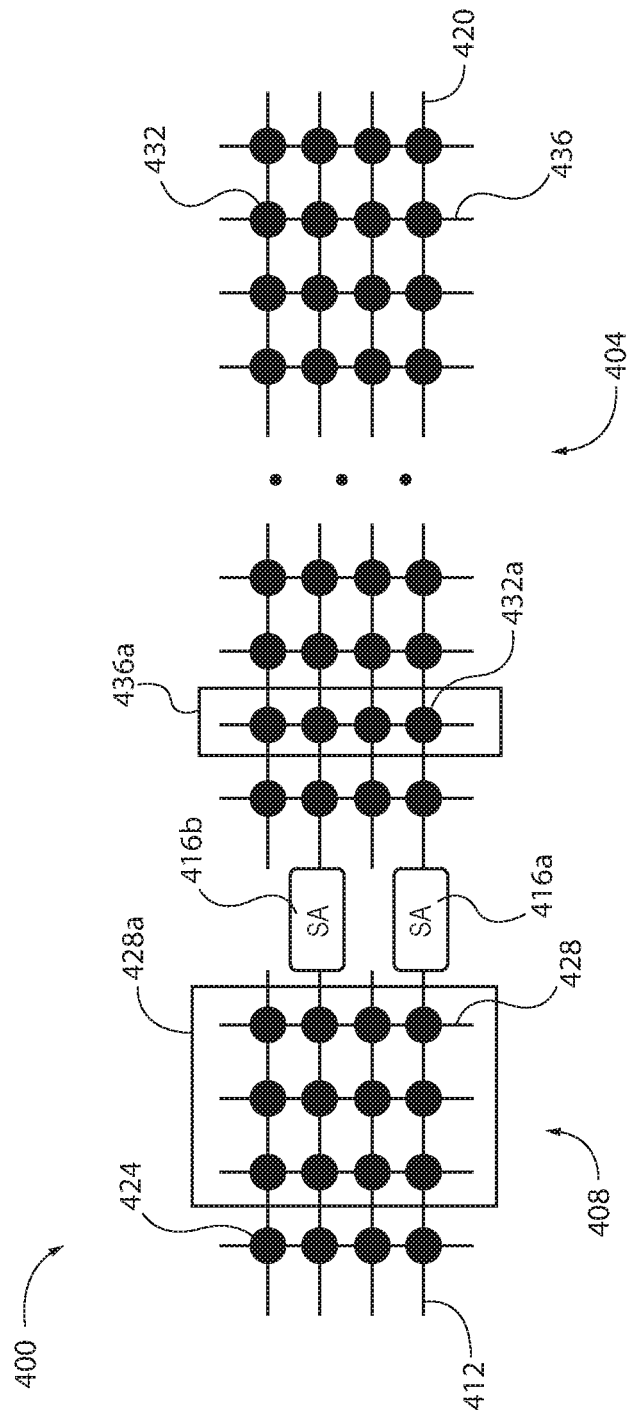
FIG. 4 is a schematic illustration of a memory device embodiment that shows the activation of certain word-lines in accordance with the present disclosure.

FIG. 4 is an illustration a memory device embodiment 400 that shows the activation of certain word-lines in accordance with the present disclosure. As described in greater detail in connection with FIG. 1, a memory device embodiment 400 may include a storage array 404 and a reference array 408. Bit-line segments 412 in the reference array 408 couple to first sides of sense amplifiers 416a-b. Bit-line segments 420 in the storage array 404 couple to second sides of the sense amplifiers 416a-b. Reference array memory cells 424 are disposed at the intersection of the reference array bit-line segments 412 and reference array word-lines 428. Storage array memory cells 432 are disposed at the intersection of the storage array bit-line segments 420 and storage array word-lines 436. FIG. 4 additionally shows an activated storage array word-line 436a and a number of activated reference array word-lines 428a. The activated storage array word-line 436a may be activated in the process of accessing a particular storage array memory cell 432a. The activated reference array word-lines 428a may be activated to support a balanced operation of the sense amplifier 416a during a read operation of other memory access operation. Continuing with the example above, the memory device 400 may embody a smaller nanometer processes such that Vary for the memory device 400 is approximately 1V. As described above, the Cd/Cs ratio for such a device can be less than or around approximately 2. Thus, a balanced operation of the sense amplifier 416a may be correspond to the reference array bit-lines 412 having a capacitance of three individual memory cells. Because the capacitance of the reference array bit-lines 412 itself may be ignored, the proper balancing capacitance may be achieved by activating three reference array word-lines, as indicated in FIG. 4 by reference numeral 428a It should be appreciated that Equation (3) was derived for the particular of the smaller nanometer example where Vary is around approximately 1V. Given this constraint, the amount of capacitance for the reference array bit-line segment was determined to be approximately three times the amount of capacitance present in an individual memory cell. More generally, Equation (1) may be used to derive balancing capacitances for any particular memory arrangement or process. First, Equation (1) may be used to derive a Cd/Cs ratio given the voltage signal level constraints for a given memory process. Given that the capacitance on the storage array bit-line segment corresponds to quantity (Cd+Cs), the Cd/Cs ratio may be used to approximate the capacitance needed for the reference array bit-line segment as multiple of the capacitance of an individual memory cell. The proper balancing capacitance for the reference array bit-line segment may therefore be achieved by activating a corresponding number of word-lines in the reference array.

Dummy Word-Line Balancing

The load balancing discussed above generally applies to the operation of the sense amplifiers when word-lines are activated during a memory read or other memory access operation. For example, in the smaller nanometer processes, the Cd/Cs ratio may be approximately two. With three word-lines activated in the reference array, the load will be balanced by Cd+Cs=3Cs because bit-line capacitance is negligible on the reference side. However, in this same arrangement, the sense amplifier's load may become unbalanced during the pre-charge phase because the sense amplifier's load becomes the capacitance of the bit-line capacitance (Cd) only on the activated side.

Present embodiments may use dummy word-lines in order to improve the sense amplifier balance during the pre-charge phase. Typically, a word-line or dummy word-line is activated to read out a particular memory cell or to support the sense amplifier in such an operation. Thus, a word-line or dummy word-line is typically asserted during the read out or amplification phase of a memory access operation. In contrast, present embodiments may activate one or more dummy word-lines during the pre-charge phase and thus out of the typical sequence of memory component activation. By asserting one or more dummy word-lines, present embodiments may maintain the load on the storage array bit-line segment at Cd+Cs during the pre-charge phase. In this way, the load on the storage array bit-line may be maintained at Cd+Cs throughout the operation of the memory array.

Figure 5:
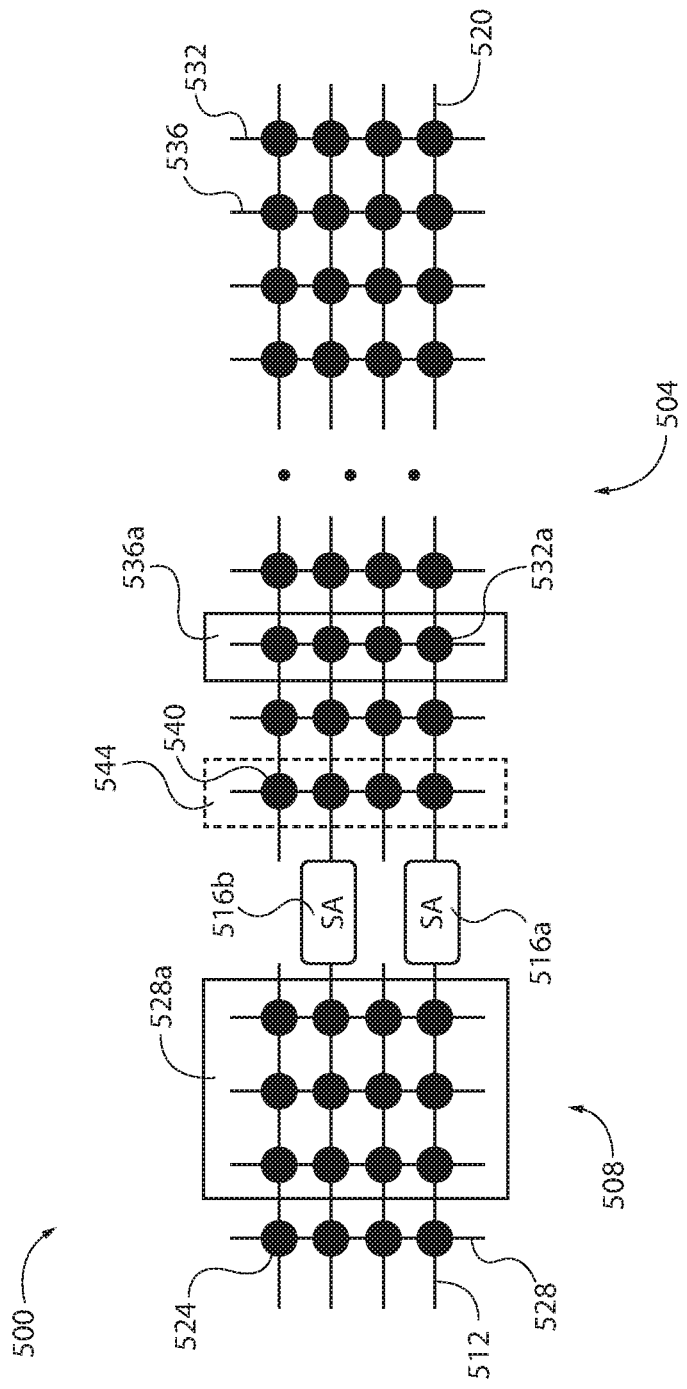
FIG. 5 is a schematic illustration of a memory device embodiment that shows the use of dummy word-lines to improve sense amplifier balance during the pre-charge phase in accordance with the present disclosure.

FIG. 5 is an illustration a memory device embodiment 500 that shows the use of dummy word-lines to improve the sense amplifier balance during the pre-charge phase in accordance with the present disclosure. As described in greater detail in connection with FIG. 1, a memory device embodiment 500 may include a storage array 504 and a reference array 508. Bit-line segments 512 in the reference array 508 couple to first sides of sense amplifiers 516a-b. Bit-line segments 520 in the storage array 504 couple to second sides of the sense amplifiers 516a-b. Reference array memory cells 524 are disposed at the intersection of the reference array bit-line segments 512 and reference array word-lines 528. Storage array memory cells 532 are disposed at the intersection of the storage array bit-line segments 520 and storage array word-lines 536. The memory device 500 may additionally include one or more dummy memory cells 540 that are disposed at the intersection of a dummy word-line 544 and a bit-line segment 520.

FIG. 5 also shows an activated storage array word-line 536a and a number of activated reference array word-lines 528a. The activated storage array word-line 536a may be activated in the process of accessing a particular storage array memory cell 532a. The activated reference array word-lines 528a may be activated to support a balanced operation of the sense amplifier 516a during a read operation of other memory access operation. Prior to the amplification phase of the memory access operation, the bit-line segments 512, 520 may be pre-charged during an equalization phase of the memory access operation. Here, one or more dummy word-lines 544 may be activated during the pre-charge phase in order to provide a faster and/or more effective equalization.

Continuing with the smaller nanometer process example above, three word-lines may be activated in the reference array 508 so as to balance the capacitance of the bit-line segment 512 and the memory cell 532a during the amplification phase. In the pre-charge phase, the memory cell 532a is not coupled to the bit-line segment 520 and so does not contribute to the balancing of the bit-line segment 512 with the bit-line segment 520. In order to compensate for this, a dummy word-line 544 may be asserted during the pre-charge phase. The dummy word-line 544 is generally asserted when the word-line 536a is not asserted. Similarly, the word-line 536a may asserted when the dummy word-line 544 is not asserted. Advantages gained by asserting the dummy word-line 544 are illustrated in FIG. 6.

Figure 6A:
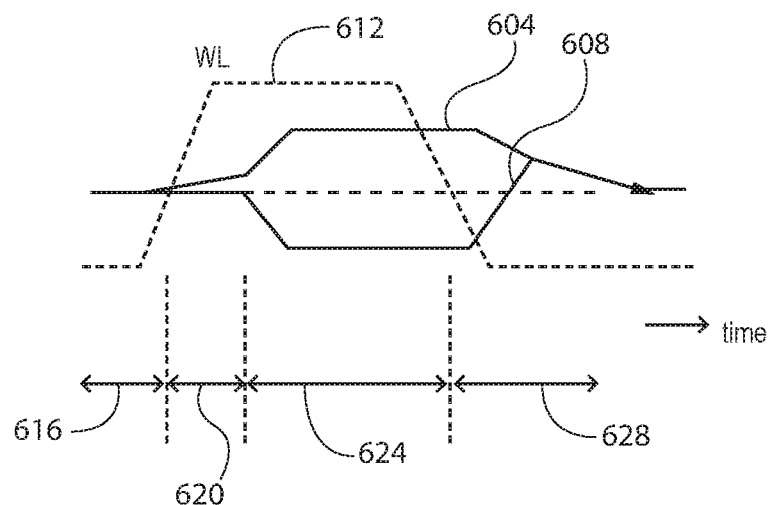
FIGS. 6A-B are signal trace diagrams that compare the behavior of a memory circuit embodiment with and without the use of a dummy word-line.
Figure 6B:
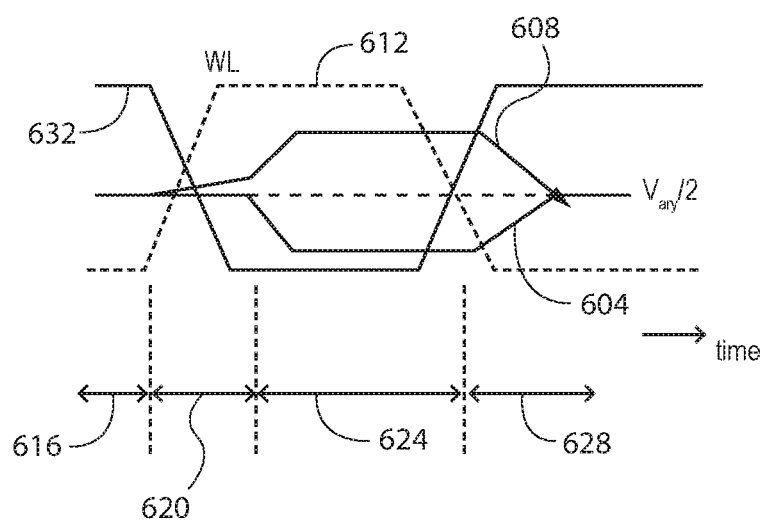

FIGS. 6A-B are signal trace diagrams that compare the behavior of an example memory circuit 500 with and without the use of a dummy word-line. FIGS. 6A-B include a BLT (bit-line true) signal trace 604 that corresponds to the bit-line segment 520 associated with the storage array 504. The BLB (bit-line bar) signal trace 608 corresponds to the bit-line segment 512 associated with the reference array 508. The WL (write line) signal trace 612 corresponds to the word-line 536a that is asserted to couple the memory cell 532a to the storage array bit-line segment 520 in connection with a memory access operation for the memory cell 532a. FIG. 6A includes an initial phase 616 where the word-line 536a is de-asserted and bit-line segments 512, 520 are pre-charged. Here, the word-line signal trace 612 is low, and the BLT signal trace 604 and the BLB signal trace 608 indicate a voltage of Vary/2. Following the initial phase 616, a charge sharing phase 620 occurs where the word-line 536a is asserted and the charge in the desired memory cell 532a is transferred from the memory cell 532a to the storage array bit-line segment 520. Here, the WL signal trace 612 goes from low to high and the BLT signal trace 604 rises above Vary/2. Following the charge-sharing phase 620, an amplification phase 624 occurs where the sense amplifier 516a amplifies the voltage difference on the bit-line segments 512, 520. Here, BLT signal trace 604 rises to Vary and the BLB signal trace 608 falls to Vss. Following the amplification phase 624, a pre-charge phase 628 occurs where the word-line 536a is de-asserted and the bit-line segments 512, 520 are pre-charged. Here, WL signal 612 goes low, and the BLT signal 604 and the BLB signal 608 are driven to Vary/2.

FIG. 6A illustrates the behavior of the example memory circuit 500 without the use a dummy word-line 544. FIG. 6B illustrates the behavior of the example memory circuit 500 with the use of a dummy word-line 544. FIG. 6B includes a dummy WL trace 632 that corresponds to the dummy word-line 544. As mentioned, the dummy word-line 544 may be asserted when the word-line 536a is not asserted. Thus, the dummy WL signal 632 goes high when the WL signal 612 goes low and vice versa. Thus, the dummy WL signal 632 is de-asserted during the charge-sharing phase 620 and the amplification phase 624. In these phases, the total capacitance on the storage array side of the sense amplifier 516a corresponds to the bit-line capacitance plus the desired storage cell capacitance, which total capacitance is balanced by the word-lines 528a asserted on the reference array side of the sense amplifier 516a. In the pre-charge phase 628, this balance is maintained in the absence of the capacitance from the desired memory cell 532a through the capacitance of the memory cell attached to the dummy word-line 544. Without this use of the dummy word-line 544, the sense amplifier operation may become unbalanced due the capacitive mismatch. As shown in FIG. 6A, the BLB signal 608 may rise faster than the BLT signal 604 falls. This may result in the BLB signal overshooting the Vary/2 level. This behavior does not occur when the dummy word-line 544 is asserted. As shown in FIG. 6B, the BLT signal 604 and the BLB signal 608 change at the same rate. Here, no overshoot occurs and the BLT signal 604 and the BLB signal 608 reach Vary/2 faster.

Figure 7:
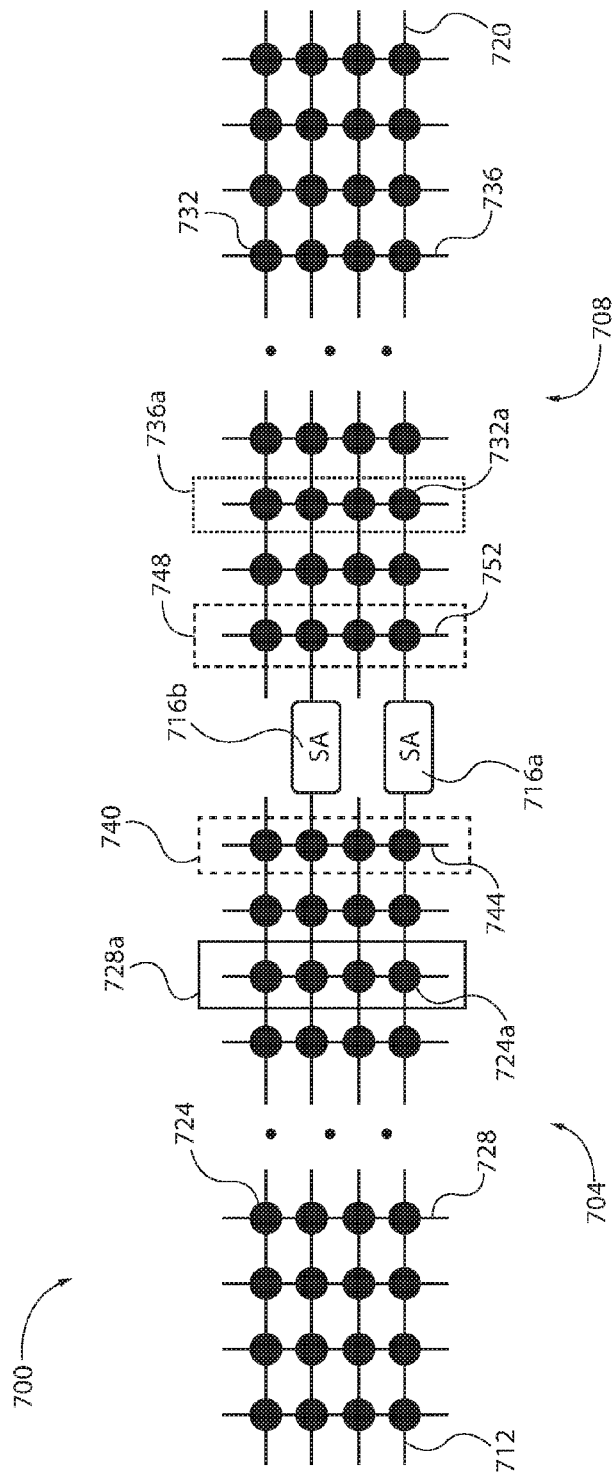
FIG. 7 is a schematic illustration of a memory device embodiment that includes the use of dummy word-lines in adjacent storage arrays to improve the sense amplifier balance during the pre-charge phase in accordance with the present disclosure.

FIG. 5 and FIG. 6 illustrate the use of dummy words lines in the operation of an sense amplifier that is arranged between a reference array and a storage array. As shown in FIG. 7 and FIG. 8, this concept can be extended to include the operation of a sense amplifier that is arranged between two storage arrays. In some conventional memory device schemes, a non-negligible imbalanced sense amplifier occurs at small Cd/Cs ratios. For example, some conventional memory device schemes may have zero offsets as high as 20% to 30% of the sense amplifier signal amount. In order to overcome this difficultly and to keep the sense amplifier's load balanced throughout the various phases of the memory device operation, one or more dummy word-lines may activated reversely in one or more storage arrays, as shown in Table (1) below. Here, either a word-line or a dummy word is activated at a given time. Because a word-line is activated at any given time, the sense amplifier's load becomes Cd+Cs at all times and on both sides of the sense amplifier. Also, this operation provides write line coupling-noise reduction so that the sense amplifier's operational margin is improved by adding up its effect on the sense amplifier's load balance. Finally, this technique helps bit-line extension due to improvement in sense amplifier's operation margin. Specifically, this technique may cancel that offset of the reference side.

TABLE 1

| | conventional | | embodiment | |
|---|---|---|---|---|
| | activated sec | referece sec | activated sec | reference sec |
| @Active | Cd + Cs | Cd | Cd + Cs | Cd + Cs |
| @EQ | Cd | Cd | Cd + Cs | Cd + Cs |

FIG. 7 is an illustration a memory device embodiment 700 that includes the use of dummy word-lines in adjacent storage arrays to improve the sense amplifier balance during the pre-charge phase in accordance with the present disclosure. A memory device embodiment 700 may include a first storage array 704 and a second storage array 708. Bit-line segments 712 in the first storage array 704 couple to first sides of sense amplifiers 716a-b. Bit-line segments 720 in the second storage array 708 couple to second sides of the sense amplifiers 716a-b. First storage array memory cells 724 are disposed at the intersection of the first storage array bit-line segments 712 and the first storage array word-lines 728. Second storage array memory cells 732 are disposed at the intersection of the second storage array bit-line segments 720 and second storage array word-lines 736.

The first storage array 704 may include at least one dummy word-line 740 that is disposed at the intersection of a dummy word-line 744 and a bit-line segment 712. In one respect, the dummy word-line 740 may be activated to provide balancing capacitance for the sense amplifier 716a-b during a memory access operation directed to the second storage array 708. For example, a particular second storage array memory cell 732a may be accessed via a memory access operation that includes activating the corresponding storage array word-line 736a. In this memory access operation, the first storage array 704 is the "reference" side of the sense amplifier 716a, and the second storage array 708 is the "activated" side of the sense amplifier 716a. Here, the dummy word-line 740 may be activated to balance the capacitance present on the second bit-line segment 720 due to the storage array memory cell 732a.

Similarly, the second storage array 708 may include at least one dummy word-line 748 that is disposed at the intersection of a dummy word-line 752 and a bit-line segment 720. In one respect, the dummy word-line 748 may be activated to provide balancing capacitance for the sense amplifier 716a-b during a memory access operation directed to the first storage array 704. For example, a particular first storage array memory cell 724a may be accessed via a memory access operation that includes activating the corresponding storage array word-line 728a. In this memory access operation, the first storage array 704 is the "activated" side of the sense amplifier 716a, and the second storage array 708 is the "reference" side of the sense amplifier 716a. Here, the dummy word-line 748 may be activated to balance the capacitance present on the first bit-line segment 712 due to the storage array memory cell 724a.

Prior to the amplification phase of the memory access operation, the bit-line segments 712, 720 may be pre-charged during an equalization phase of the memory access operation. Here, one or more dummy word-lines may be activated during the pre-charge phase in order to provide a faster and/or more effective equalization. In one example, one dummy word-line 740 in the first storage array 704 is activated during the equalization phase. To balance the capacitance from this dummy word-line 740, one dummy word-line 748 in the second storage array 708 is also activated during the equalization phase. Thus, in accordance with present embodiments, various dummy word-lines may be activated in both the amplification phase and the equalization phase.

Figure 8A:
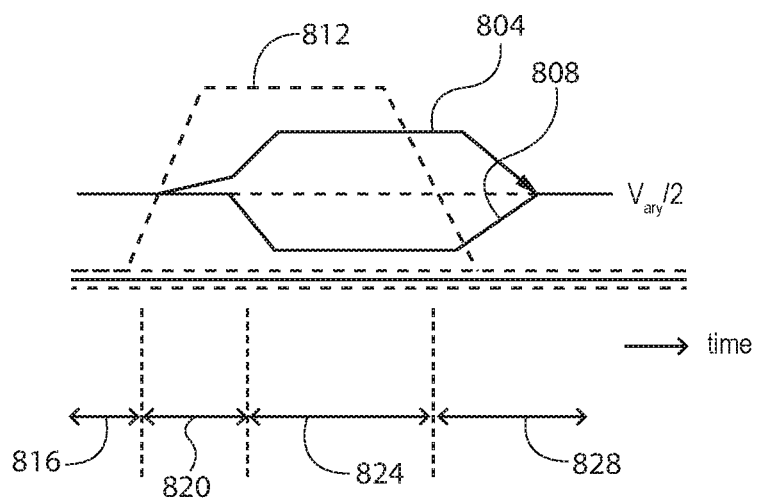
FIGS. 8A-B are signal trace diagrams that compare the behavior of a memory circuit embodiment with and without the use of a dummy word-line.
Figure 8B:
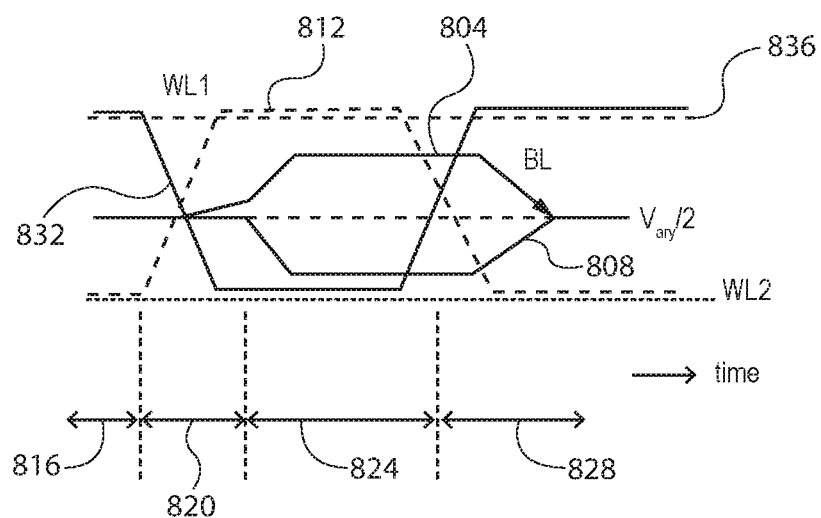

FIGS. 8A-B are signal trace diagrams that compare the behavior of an example memory circuit 700 with and without the use of a dummy word-line. By way of example, the memory access operation illustrated in FIGS. 8A-B is one where the first storage array 704 is the "activated" side of the sense amplifier 716a, and the second storage array 708 is the "reference" side of the sense amplifier 716a. FIGS. 8A-B include a BLT (bit-line true) signal trace 804 that corresponds to the bit-line segment 712 associated with the first storage array 704. The BLB (bit-line bar) signal trace 808 corresponds to the bit-line segment 720 associated with the second storage array 708. The WL1 (write line 1) signal trace 812 corresponds to the word-line 728a that is asserted to couple the memory cell 724a to the first storage array bit-line segment 712 in connection with a memory access operation for the memory cell 724a.

FIG. 8A-B includes an initial phase 816 where the word-line 728a is de-asserted and bit-line segments 712, 720 are pre-charged. Here, the word-line signal trace 728a is low, and the BLT signal trace 804 and the BLB signal trace 808 indicate a voltage of Vary/2. Following the initial phase 816, a charge sharing phase 820 occurs where the word-line 728a is asserted and the charge in the desired memory cell 724a is transferred from the memory cell 724a to the storage array bit-line segment 712. Here, the WL1 signal trace 812 goes from low to high and the BLT signal trace 804 rises above Vary/2. Following the charge-sharing phase 820, an amplification phase 824 occurs where the sense amplifier 716a amplifies the voltage difference on the bit-line segments 712, 720. Here, BLT signal trace 804 rises to Vary and the BLB signal trace 808 falls to Vss. Following the amplification phase 824, a pre-charge phase 828 occurs where the word-line 728a is de-asserted and the bit-line segments 712, 720 are pre-charged. Here, WL1 signal 812 goes low, and the BLT signal 804 and the BLB signal 808 are driven to Vary/2.

FIG. 8A illustrates the behavior of the example memory circuit 700 without the use a dummy word-line 748. FIG. 8B illustrates the behavior of the example memory circuit 700 with the use of a dummy word-line 740 in the first storage array 704 and a dummy word-line 748 in the second storage array 708. FIG. 8B includes a dummy WL1 trace 832 that corresponds to the dummy word-line 740 in the first storage array 704. As mentioned, the dummy word-line 740 may be asserted when the word-line 728a is not asserted. Specifically, the dummy WL1 signal 832 goes high when the WL signal 812 goes low and vice versa. Thus, the dummy WL1 signal 832 is asserted during the initial phase 816 and the pre-charge phase 828. The dummy WL1 signal 832 is de-asserted during the charge-sharing phase 820 and the amplification phase 824. FIG. 8B also includes a dummy WL2 trace 836 that corresponds to the dummy word-line 748 in the second storage array 708. The dummy word-line 748 in the second storage array 708 may be asserted when the word-line 728a is asserted. The dummy word-line 748 may also be asserted when the dummy word-line 740 in the first storage array 704 is asserted. Specifically, the dummy word-line 748 in the second storage array 708 may be asserted during the charge-sharing phase 820 and the amplification phase 824. Thus, the dummy WL2 signal 836 is asserted during the initial phase 816, the charge-sharing phase 820, the amplification phase 824, and the pre-charge phase 828.

In the charge-sharing phase 820 and the amplification phase 824, the total capacitance on the first storage array 704 side of the sense amplifier 716a corresponds to the capacitance of the first bit-line 712 plus the desired storage cell 724a capacitance. This total capacitance is balanced by the second bit-line 720 plus the capacitance added by the dummy word-line 748 of the second storage array 708. In the pre-charge phase 828, this balance is maintained in the absence of the capacitance from the desired memory cell 724a through the capacitance added by the dummy word-line 740 of the first storage array 704. This use of dummy word-lines 740, 748 enables the voltage on the bit-lines 712, 720 to equalize faster. Thus, as shown, the BLT signal 804 and the BLB signal 808 reach the equalization voltage of Vary/2 faster in FIG. 8B than they do in FIG. 8A.

Test Modes

Equation (1) may be used as described above to determine a number of word-lines to be activated in a reference array so as to provide balanced sense amplifier operation during a read operation or other memory access operation. However, the number derived using this process may be approximate and so may not exactly correspond to an optimal number of activated word-lines in a given memory device. Thus, a memory device may be manufactured with slightly more reference array word-lines that is indicated by Equation (1). Once such a device is manufactured, the device may undergo a testing procedure that determines more precisely the optimal number of reference array word-lines to be activated so as to provide a balanced sense amplifier operation.

Figure 9:
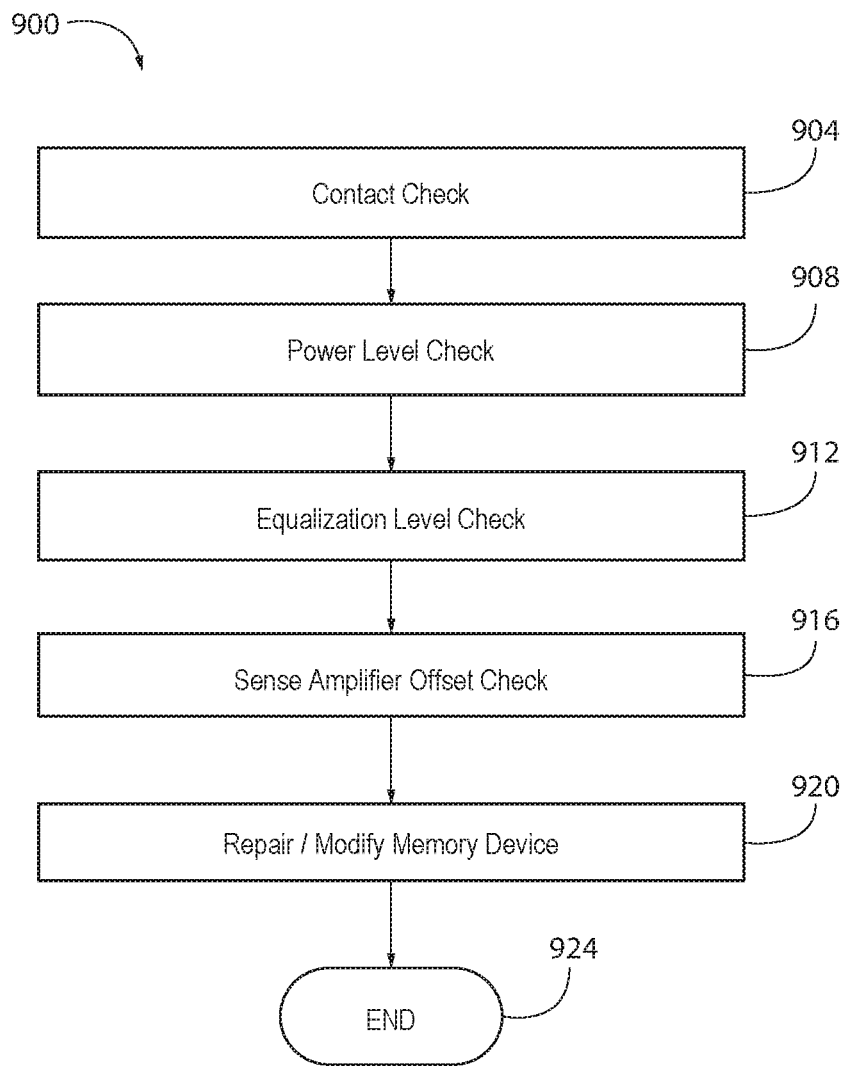
FIG. 9 is a flow chart that illustrates a test flow in accordance with present embodiments.

FIG. 9 is a flow chart 900 that provides an example test flow in accordance with present embodiments. The example test flow of FIG. 9 includes operations for determining an optimal number of activated word-lines in a memory device 100 having at least one reference array 108 in accordance with present embodiments. Initially, in operation 904, a contact check may be executed so as to determine the operational status of the pads or other external contacts associated with the memory device 100. In operation 908, a power level check may be executed so to determine the operational status of power supply components and contacts associated with the memory device 100. In operation 912, an equalization level check may be executed so as to determine the optimal number of activated word-lines for one or more reference array associated with the memory device 100. An first example system and method for preforming an equalization level check is described below in connection with FIGS. 1C, 10-11A-B. An second example system and method for preforming an equalization level check is described below in connection with FIGS. 12-13A-B. In operation 916, a sense amplifier offset check may be executed so as to determine if any particular word-line in the reference array is malfunctioning and needs to be replaced. An example system and method for preforming a sense amplifier offset check is described below in connection with FIGS. 14-15A-B. In operation 920, repairs and/or modifications may be made to the memory device under test. In operation 924 the probe test flow process may end. Once the test flow has completed, the particular "always activated" word lines may selected for use in the final product.

Referring again to FIG. 1C, which, as mentioned, is a schematic of the example memory device 100 that shows individual memory cells within a number of memory arrays. FIG. 1C additionally includes an illustration of a tester embodiment 1002a for a memory device 100 in accordance with the present disclosure. The tester 1002a may be used for an equalization level check of a memory device 100 in accordance with the present disclosure. FIG. 11B is a timing diagram that shows various signal traces that illustrate the equalization level check for the example memory device 100. As mentioned in connection with operation 912 above, an equalization level check may be executed so as to determine the optimal number of activated word-lines for one or more reference arrays associated with a memory device. As described in greater detail in connection with FIGS. 1A-C, a memory device embodiment 100 may include a storage array 104 and a reference array 108. Bit-line segments 172 in the reference array 108 couple to first sides of sense amplifiers 124. Bit-line segments 168 in the storage array 104 couple to second sides of the sense amplifiers 124. Reference array memory cells 128 are disposed at the intersection of the reference array bit-line segments 172 and reference array word-lines 132. A reference array word decoder 116a is configured to selectively activate and de-activate the reference array word-lines 132 (See reference number 1105 in FIG. 11B). Storage array memory cells 128 are disposed at the intersection of the storage array bit-line segments 168 and storage array word-lines 132. A storage array word decoder 116b is configured to selectively activate and de-activate the storage array word-lines 132.

The tester 1002a may include a test mode option signal (TmEdgeFz) 1048 that is coupled to a word decoder 116a associated with the reference array 108. The word decoder 116a may be configured to activate combinations of word-lines 132 in the reference array 108. More specifically, the word decoder 116a may assert or de-assert the word-lines 132 in the reference array 108 in combinations specified by inputs to the word decoder 116a. In test mode, the test mode option signal 1048 may provide input to word decoder 116a and, in so doing, selectively activate the word-lines 132 in the reference array 108. In some implementations, the test mode option signal 1048 has one signal line per signal line in the word decoder 116a output. Here, a word-line 116a is activated by the assertion of a corresponding signal line in the test mode option signal 1048.

The tester 1002a may also include a power amplifier enable signal (VBLR) 1052 that is configured to enable and disable a power amplifier associated with the sense amplifiers 124. Referring to the example sense amplifier 200 of FIG. 2, the power amplifier enable signal 1052 may be coupled to the VBLP power supply 216 that is coupled to the second transistor group 224, specifically to the first n-channel transistor 228a and to the third re-channel transistor 228b. The power amplifier enable signal 1052 may be asserted to enable the VBLP power supply 216. When enabled, the VBLP power supply 216 may power the first n-channel transistor 228a and the third n-channel transistor 228c so as to equalize the first bit-line 204a and the second bit-line 204b as described about in connection with FIG. 2. The power amplifier enable signal 1052 may be de-asserted to disable to VBLP power supply 216. When the VBLP power supply 216 is disabled, the first n-channel transistor 228a and the third n-channel transistor 228c are removed from the circuit and the first bit-line 204a and the second bit-line 204b are shorted together. Thus, with VBLP power supply 216 disabled, the sense amplifier enters a "voltage sharing" mode where voltage is shared between the first and second sides of the sense amplifier 200 (See reference number 1109 in FIG. 11B).

The tester 1002a may also include an equalization signal (BLEQf) 1056 that is configured to enable an equalization function of the sense amplifiers 124 (See reference number 1113 in FIG. 11B). Referring to the example sense amplifier 200 of FIG. 2, the equalization signal 1056 may correspond to the BLEQ signal 232 that is connected to the gates of the transistors in the first group 220, specifically the first n-channel transistor 228a, the second n-channel transistor 228b, and the third n-channel transistor 228c.

The tester 1002a may also include a bit-line merge signal (TmBLMerge) 1060 that is configured to enable various components that together merge and provide output from a number of bit-line segments (See reference number 1117 in FIG. 11B). Here, the bit-line merge signal 1060 may be coupled components of an transistor edge network 1068. The edge network 1068 may include a plurality of bit-line transistors 1072. Each of the bit-line transistors 1072 is connected to one of the reference array bit-lines segments 172. As shown in FIG. 1C, the bit-line transistors 1072 may be connected in parallel. Alternatively, (as described in greater detail in connection with FIG. 10) the bit-line transistors 1072 may be connected in series. The bit-line merge signal 1060 provides the gate signal for each of the bit-line transistors 1072. Through this configuration, the edge network 1068 may be generally configured to receive merged bit-line output (See reference number 1121 in FIG. 11B) and to further merge that input into a bundled output signal 1076 (See reference number 1125 in FIG. 11B). More specifically, the bit-line transistors 1072 receive merged bit-line output from each bit-line in the reference array 108 and, when enabled by the bit-line merge signal 1060, join those outputs together into a bundled output 1076.

The tester 1002a may additionally include a comparator 1080 having a first input that is configured to receive the bundled output 1076. A second input of the comparator may couple to a reference voltage, which in one embodiment is VBLR. The comparator 1080 may be configured to compare the bundled output signal 1076 to the reference voltage and to provide a responsive output signal at a comparator output 1084. The tester 1002a may then provide the edge comparator 1080 output on a global bit (MIO) line through a dedicated edge output pathway that bypasses the RWAMP circuits 1088 associated with the memory device 100. Control circuits for the RWAMP circuits are described in greater detail below in connection with FIGS. 18A-B. In one embodiment, the comparator output 1084 provides either a high or low signal based on a comparison of its inputs. A high output signal may correspond to the first input signal being greater than the second input signal. A low output signal may correspond to the second input signal being greater than the first input signal. By placing the comparator 1080 outside of and/or adjacent to the memory array 100, the accuracy of the test signal is improved at least because unwanted parasitic elements are reduced.

Figure 10:
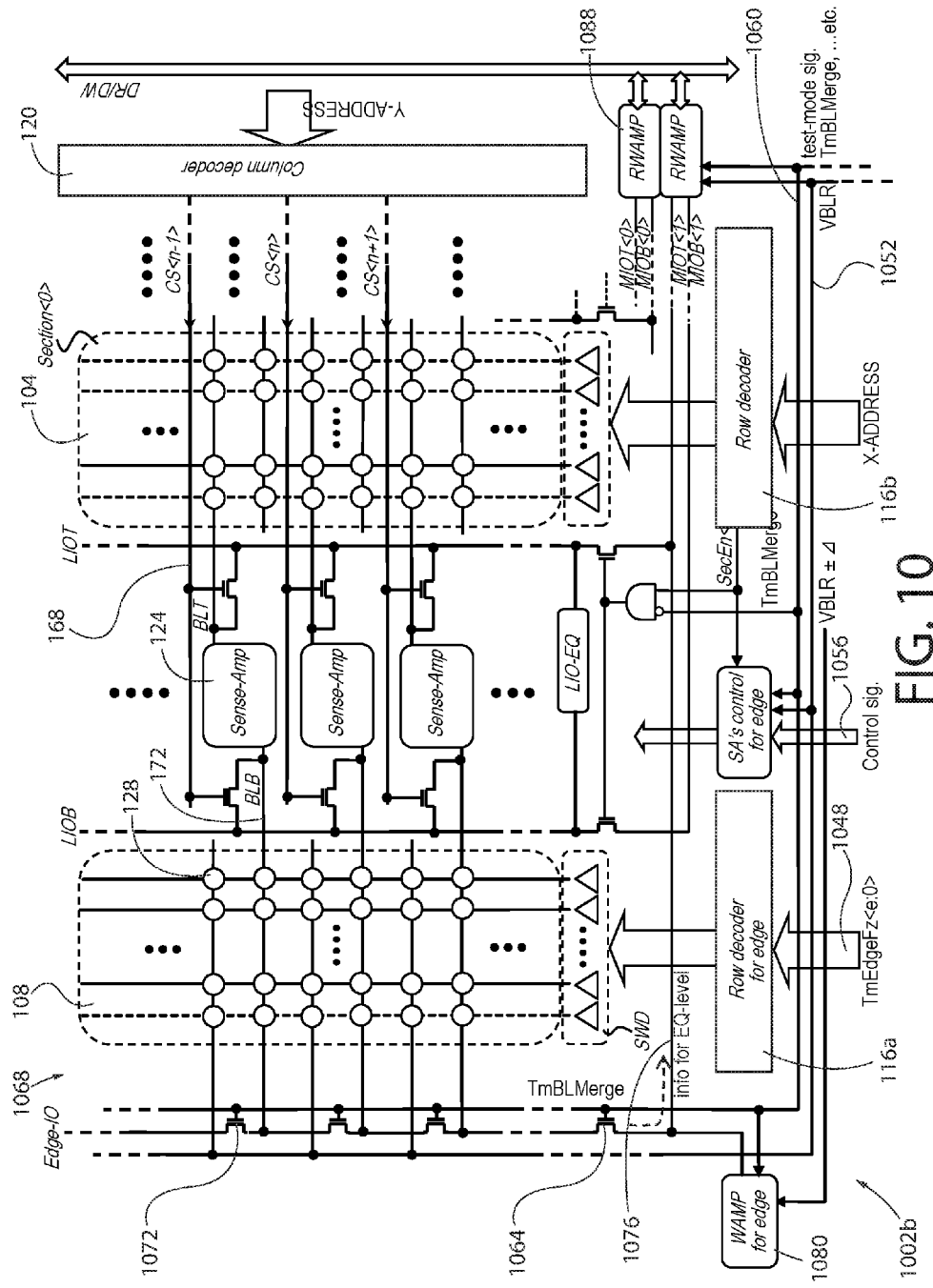
FIG. 10 is a schematic illustration of a tester embodiment for a memory device in accordance with the present disclosure.

FIG. 10 is schematic illustration of an example memory device that includes an alternative tester 1002b configuration. Like the tester 1002a illustrated in FIG. 1C, the tester 1002b of FIG. 10 may be used for an equalization level check of a memory device 100 in accordance with the present disclosure. Like the tester 1002a, the tester 1002b may include a test mode option signal (TmEdgeFz) 1048 that is coupled to a word decoder 116a associated with a reference array 108, a power amplifier enable signal (VBLR) 1052 that is configured to enable and disable a power amplifier associated with sense amplifiers 124, and an equalization signal (BLEQf) 1056 that is configured to enable an equalization function of the sense amplifier 124. These signals and components are described in greater detail above in connection with FIG. 1C.

The tester 1002b may also include a bit-line merge signal (TmBLMerge) 1060 that is configured to enable various components that together merge and provide output from a number of bit-line segments. Here, the bit-line merge signal 1060 may be coupled to the gate of an output transistor 1064, which is a component of an transistor edge network 1068. In addition to the output transistor 1064, the edge network 1068 includes a plurality of bit-line transistors 1072. Each of the bit-line transistors 1072 is connected to one of the reference array bit-lines segments 172. The bit-line transistors 1072 are connected in series such that they are connected at one end to the output transistor 1064. The bit-line merge signal 1060 provides the gate signal for each of the output transistors 1064. Through this configuration, the edge network 1068 may be generally configured to receive merged bit-line output and to further merge that input into a bundled output signal 1076. More specifically, the bit-line transistors 1072 receive merged bit-line output from each bit-line in the reference array 1008 and, when enabled by the bit-line merge signal 1060, join those outputs together into a bundled output 1076 that is output by the output transistor 1064.

The tester 1002b may additionally include a comparator 1080 having a first input that is coupled to the second end of the output transistor 1064. A second input of the comparator may couple to a reference voltage, which in one embodiment is VBLR. The comparator 1080 may be configured to compare the bundled output signal 1076 provided by the output transistor 1064 to the reference voltage and to provide a responsive output signal at a comparator output 1084. The tester 1002b may then provide the edge comparator 1080 output on a global bit (MIO) line through an output pathway that includes the RWAMP circuits 1088 associated with the memory device 100. In one embodiment, the comparator output 1084 provides either a high or low signal based on a comparison of its inputs. A high output signal may correspond to the first input signal being greater than the second input signal. A low output signal may correspond to the second input signal being greater than the first input signal. By placing the comparator 1080 outside of and/or adjacent to the memory array 100, the accuracy of the test signal is improved at least because unwanted parasitic elements are reduced.

Figure 11A:
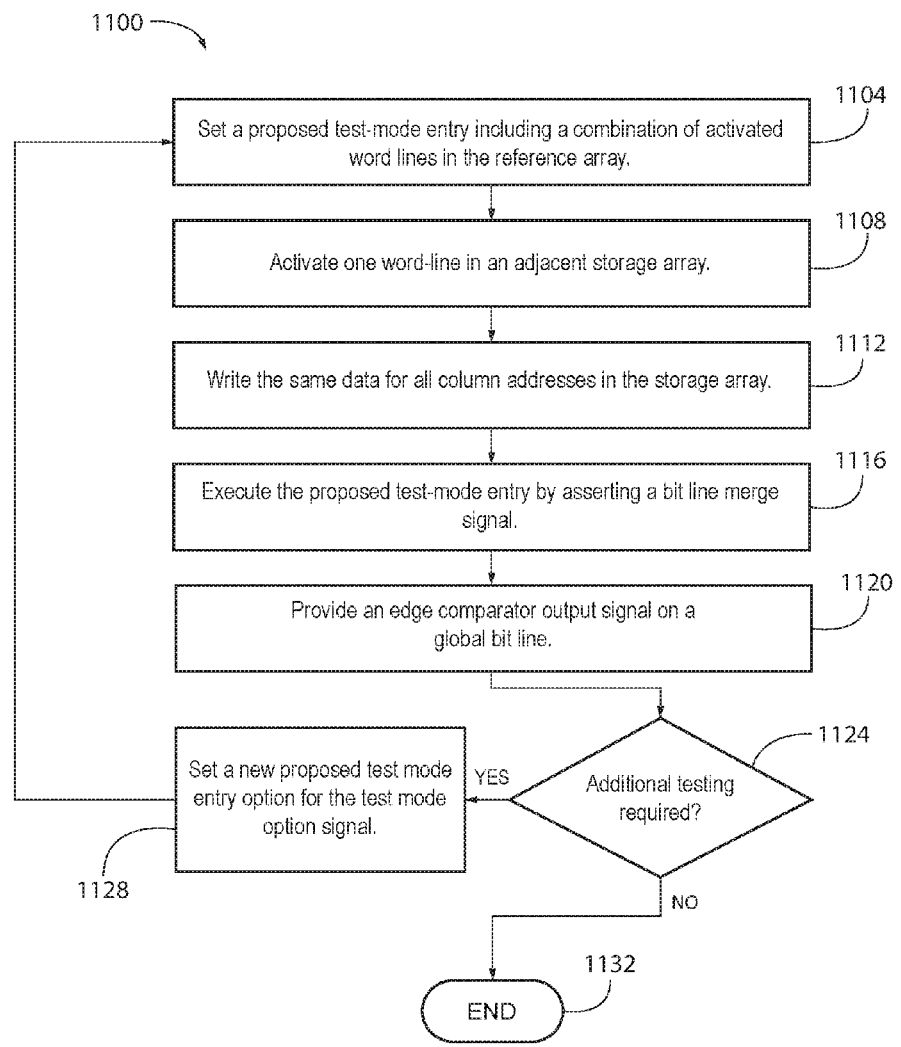
FIG. 11A is a flow chart that illustrates a test-mode that executes a check of equalization levels in accordance with a first embodiment.
Figure 11B:
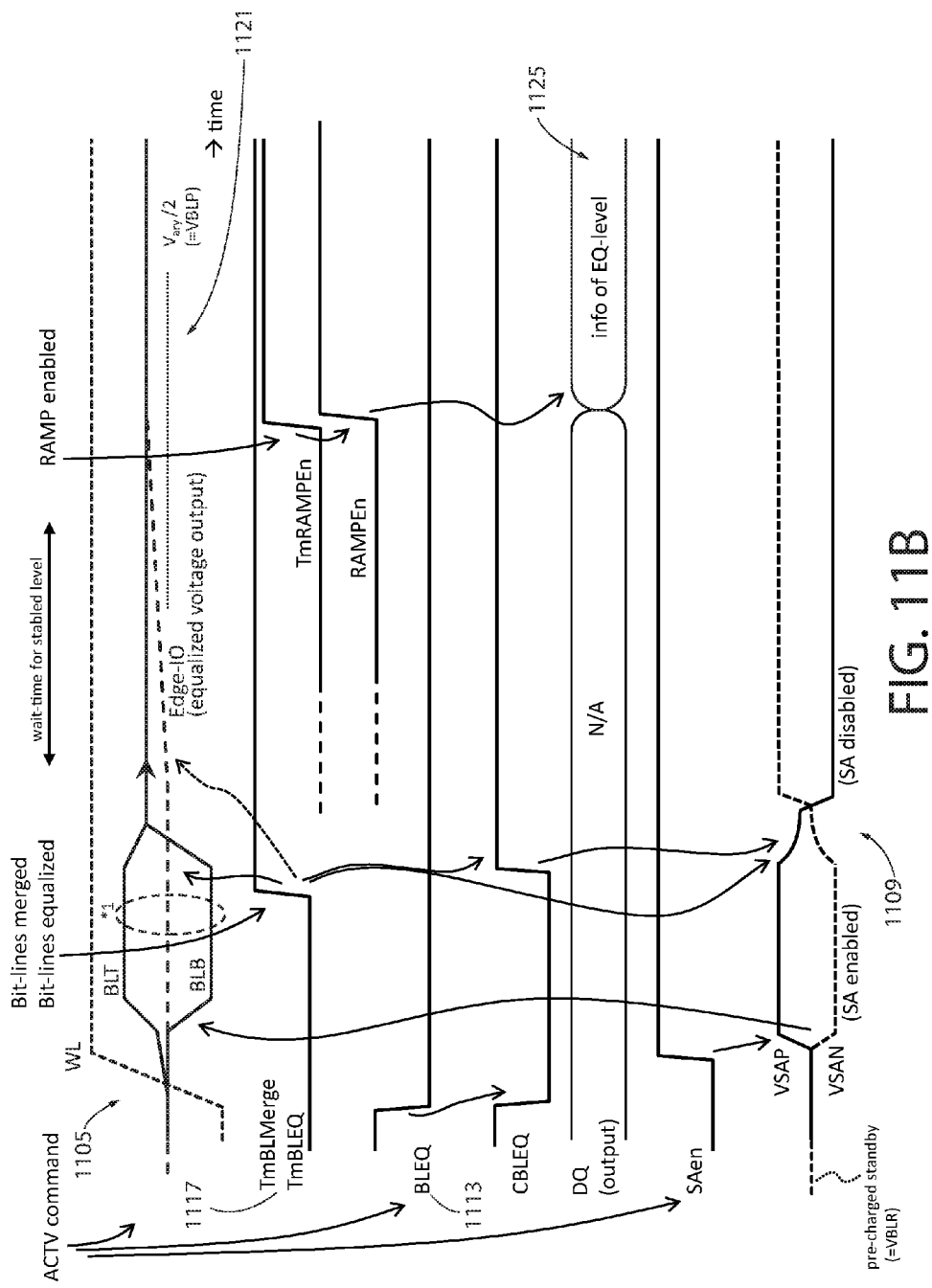
FIG. 11B is a timing diagram that shows various signal traces that illustrate an equalization level check for a memory device in accordance with the present disclosure.

FIG. 11A is a flow chart 1100 that illustrates a test-mode that executes a check of equalization levels in accordance with a first embodiment. The test mode illustrated in FIG. 11A may be executed using the tester 1002a illustrated in FIG. 1C. Alternatively, the test mode illustrated in FIG. 11 may execute using the tester 1002b illustrated in FIG. 10. The test-mode generally adjusts a load balance for bit-line pairs on the edge sense amplifier region by selecting the always activated word-lines in the edge array. As mentioned, "always activated" word-lines are activated during each memory access operation so as to add balancing capacitance. The tester 1002a-b generally operates by finding a load balanced option by changing a number of activated word-lines in the edge array. More specifically, the tester loops through a set of test procedure steps until an optimal number of word-lines is found.

In operation 1104, the tester 1002a-b sets a proposed test-mode entry. The proposed test-mode entry generally corresponds to a particular combination of activated word-lines 132 in the reference array 108. On a first pass through the set of test procedure steps, the proposed test-mode entry may correspond to only one word-line 132 being asserted. On successive passes through the set of test procedure steps, additional word-lines 132 may be added such that progressively more word-lines 132 are included in the test-mode entry. For example, one word-line 132 may be activated on the first pass, two word-lines 132 may be activated on the second pass, three word-lines 132 may be activated on the third pass, and so on. As mentioned, particular combinations of word-lines 132 may be activated via the test mode option signal 1048. Thus, in operation 1104, the tester 1002a-b asserts an appropriate combination of signals on the test mode option signal 1048 depending on the number of passes through the test mode procedure that have taken place so far. Based on this signal, the appropriate number of word-lines 132 in the reference array 108 are activated via the operation of the reference array word decoder 116a.

In operation 1108, the tester 1002a-b activates one word-line 132 in the adjacent storage array 104. In so doing, the tester 1002a-b prepares the storage array 104 for a write operation on the activated word-line 132. The tester 1002a-b may provide an appropriate control signal to the storage array word decoder 116a. Based on the input control signal, the storage array word decoder 116*a* may assert the desired word-line 132 in the storage array 104. With the desired word-line asserted 132, the various memory cells on the word-line 132 couple to the word-line through the operation of an access transistor as described in connection with FIGS. 1A-C. With the memory cells so coupled, the storage array 104 is prepared for a write operation on the activated word-line 132.

In operation 1112, the tester 1002*a-b* writes the same data for all column addresses in the storage array 104. More specifically, the tester 1002*a-b* asserts the same data on all of the bit-lines 168 in the storage array 104. This memory write operation may be executed via the bit decoder discussed above in connection with FIGS. 1A-C. In one embodiment, the tester 1002*a-b* executes the memory write through an appropriate memory operation such as a Y-scan operation or the like. Additionally, in operation 1112, the tester 1002*a-b* turns off the VBLP power supply 216. As mentioned, this may be achieved by de-asserting the power amplifier enable signal 1052. With the VBLP power supply 216 turned-off, the reference side of the sense amplifiers 1016 sets to the reversed data and VBLP's source-line (VBLsr) sets to floating Vary/2.

In operation 1116, the tester 1002*a-b* executes the proposed test-mode entry by asserting the bit-line merge signal 1060. While keeping the word-lines active, the tester 1002*a-b* asserts the bit-line equalization signal 1056 to short/merge multi bit-lines 172 in the reference array 108 with bit-lines 168 in the storage array 104. The shorted bit-lines are then output through the edge bit-line that are bundled together through the bit-line transistors 1072. This output may be received at the comparator 1080 that is disposed outside of and/or adjacent to the memory array 100. In a configuration such as shown in FIG. 10 where the bit-line transistors 1072 are connected in series, bundled output from the bit-line transistors 1072 may be provided to an output transistor 1064, which, in turn provides output to the comparator 1080.

In operation 1120, the tester 1002*a-b* provides the output signal 1084 of the edge comparator 1080 on a global bit (MIO) line. In the embodiment of FIG. 1C, the tester 1002*a* provides the edge comparator 1080 output on a global bit (MIO) line through a dedicated edge output pathway that bypasses the RWAMP circuits 1088 associated with the memory device 100. In the embodiment of FIG. 10, the tester 1002*b* provides the edge comparator 1080 output on a global bit (MIO) line through an output pathway that includes the RWAMP circuits 1088 associated with the memory device 100. As described in connection with FIG. 2, a global bit-line connects to data readout circuits that are coupled to or otherwise associated with a memory device. Generally, data is write in and read out of the memory device by being written across the global bit-lines and into and out of an individual memory cells. This data pathway may also be used to read test data out of the memory device. Thus, in operation 1120, the tester 1002*a-b* makes use of the data pathway and reads out test data across the global bit-lines. In some cases, the tester 1002*a-b* may execute a delay prior providing the output signal 1084 in order to allow the output signal levels to stabilize. For example, the tester 1002*a-b* may wait a few micro seconds for signal levels to stabilize.

In operation 1124, the tester 1002*a-b* may determine if additional testing is required. More specifically, the tester 1002*a-b* may determine if an additional pass through the set of test procedure steps is needed. This determination may be based on whether or not a change in output signal 1084 is detected. A change in the output signal 1084 may occur when the output swings from either high to low or from low to high. When either of these two transistors occurs, it may be determined that the capacitance on the bit-lines 168, 172 is substantially balanced. At this point, the optimal number of always activated word-lines is determined.

If additional testing is required, operation 1128 follows operation 1124. In operation 1128, the tester 1002*a-b* sets a new proposed test mode entry option for the test mode option signal 1048. Operation 1104 follows operation 1128 such that the test flow is repeated with the new test mode entry option. If no additional testing is required, operation 1132 follows operation 1124. In operation 1132, the tester ends the test flow.

Figure 12:
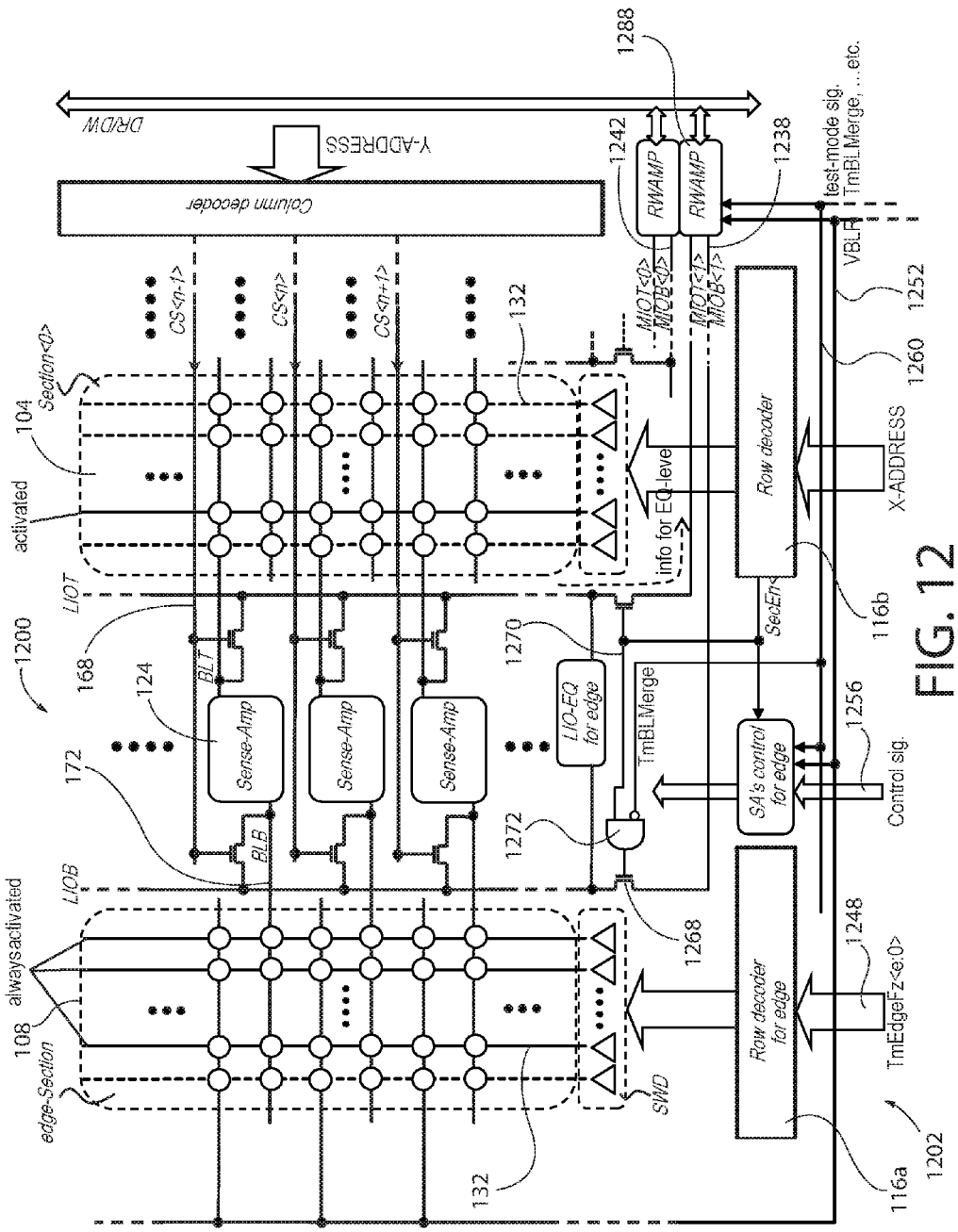
FIG. 12 is a schematic illustration of a tester embodiment for a memory device in accordance with the present disclosure.

FIG. 12 is an illustration a tester embodiment 1202 for a memory device 1200 in accordance with the present disclosure. The tester 1202 may be used for an equalization level check of a memory device 1200 in accordance with the present disclosure. FIG. 13B is a timing diagram that shows various signal traces that illustrate the equalization level check for the example memory device 100. As mentioned in connection with operation 912 above, an equalization level check may be executed so as to determine the optimal number of activated word-lines for one or more reference arrays associated with a memory device. The tester 1202 may be used implemented as an alternative to the test-mode for equalization level checking of FIG. 1C and FIG. 10. The tester 1202 may be configured to adjust edge dummy memory cell capacitance in connection with a normal read operation. Here, the tester 1202 may use RWAMP circuits that are shared between normal operation circuits and test operations circuits based on a input selector.

As mentioned, an equalization level check may be executed so as to determine the optimal number of activated word-lines for one or more reference arrays associated with a memory device. As described in greater detail in connection with FIGS. 1A-C, a memory device embodiment 1200 may include a storage array 104 and a reference array 108. Bit-line segments 172 in the reference array 108 couple to first sides of sense amplifiers 124. Bit-line segments 168 in the storage array 104 couple to second sides of the sense amplifiers 124. Reference array memory cells 128 are disposed at the intersection of the reference array bit-line segments 172 and reference array word-lines 132. A reference array word decoder 116*a* is configured to selectively activate and de-activate the reference array word-lines 132. Storage array memory cells 128 are disposed at the intersection of the storage array bit-line segments 168 and storage array word-lines 132. A storage array word decoder 116*b* is configured to selectively activate and de-activate the storage array word-lines 128.

The memory device 1200 may additionally include a first global bit-line (MIO) 1238 and second global bit-line (MIO) 1242. As described in greater detail in connection with FIG. 2, global bit-lines 1238, 1242 may be associated with the sense amplifiers 124 may connect to the data readout circuits that are coupled to or otherwise associated with the memory device 1200. Generally, data is written in and read out of the memory device 1200 by being written across the global bit-lines 1238, 1242 and into and out of an individual memory cells. This data pathway may also be used to read test data out of the memory device as described in greater detail below.

The tester 1202 may include a test mode option signal (TmEdgeFz) 1248, a power amplifier enable signal (VBLsr) 1252, an equalization signal (BLEQf) 1256 (See reference number 1305 in FIG. 13B), and a bit-line merge signal (TmBLMerge) 1260 (See reference number 1309 in FIG.

13B). As described in more detail in connection with FIG. 1C and FIG. 10, the test mode option signal (TmEdgeFz) 1248 is coupled to a word decoder 116 associated with the reference array 108 and is configured to drive the word decoder 116a with various test mode inputs. The power amplifier enable signal (VBLsr) 1252 is configured to enable (See reference number 1313 in FIG. 13B) and disable (See reference number 1317 in FIG. 13B) a power amplifier associated with the sense amplifiers 124. The equalization signal (BLEQf) 1256 is configured to enable an equalization function of the sense amplifiers 124. The bit-line merge signal (TmBLMerge) 1260 that is configured to enable various components that together merge (See reference number 1321 in FIG. 13B) and provide output (See reference number 1325 in FIG. 13B) from a number of bit-line segments.

In the embodiment of FIG. 12, the bit-line merge 1260 may be coupled to a at least one of a number of transfer gates 1268, which transfer gate 1268 is preceded by an AND gate 1272. Each of the transfer gates 1268 is connected to one of the global bit-lines 1238, 1242 to thereby couple the RWAMP circuits 1288 to the sense amplifiers 124. The bit-line merge signal 1260 combines with an enable signal 1270 from the row decoder 116b through the AND gate 1272 to provide the gate signal (See reference number 1329 in FIG. 13B) for the transfer gate 1268 associated with the reference array 108. Through this configuration, the transfer gate 1268 may be generally configured to provide input to the RWAMP circuits 1288, which in turn generates global bit-line output (See reference number 1333 in FIG. 13B). More specifically, the transfer gate 1268 receives bit-line output from the sense amplifiers 124 in the memory device 1200. When the transfer gate 1268 associated with the reference array 108 is enabled by the bit-line merge signal 1260 in test mode, this transfer gate 1268 joins those outputs together into a bundled output that is provided to the RWAMP circuit 1288.

The transfer gates 1268 are connected so as to form a portion of the normal data output path to the RWAMP circuits 1288. The normal data output path includes the RWAMP circuits 1288, which are coupled on one end to a DQ pad. On an opposite end, the RWAMP circuits 1288 are coupled to a bit-line transistor network through the transfer gates 1286. The transfer gate 1268 associated with the reference array 108 is generally configured to pass either the test mode data or normal data output based on the state of output provided by the AND gate 1272. In test mode, the transfer gate 1268 associated with the reference array 108 passes bundled test data output from the reference array 108. In normal mode, the transfer gate 1268 associated with the reference array 108 passes normal data readouts.

The RWAMP circuits 1288, which is part of the normal data output path, may function similarly to the comparator 1080 discussed in connection with FIG. 1C and FIG. 10. Specifically, the RWAMP circuits 1288 may be configured to compare the bundled output signal provided by the transfer gate 1268 associated with the reference array 108 to the reference voltage and to provide a responsive output signal that is provided as input to the DQ pad. In one embodiment, a RWAMP circuit 1288 provides either a high or low signal based on a comparison of its inputs. A high output signal may correspond to the first input signal being greater than the second input signal. A low output signal may correspond to the second input signal being greater than the first input signal.

Figure 13A:
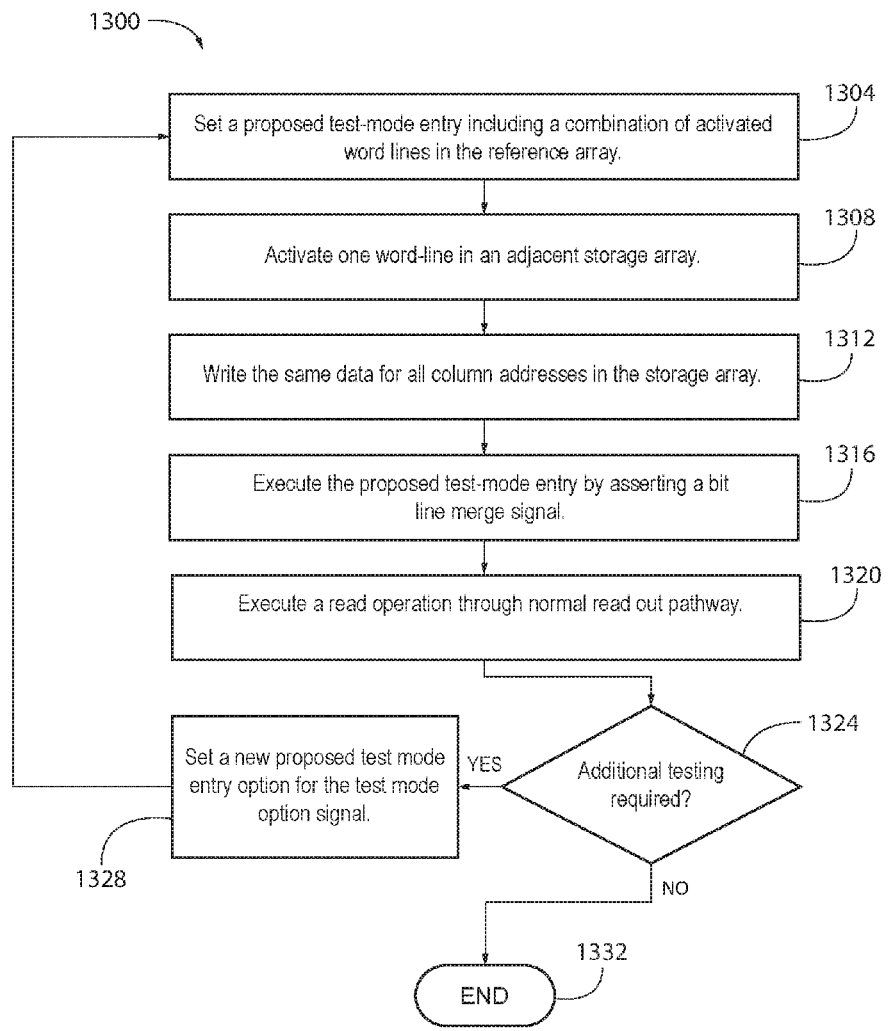
FIG. 13A is a flow chart that illustrates a test-mode that executes a check of equalization levels in accordance with a second embodiment.
Figure 13B:
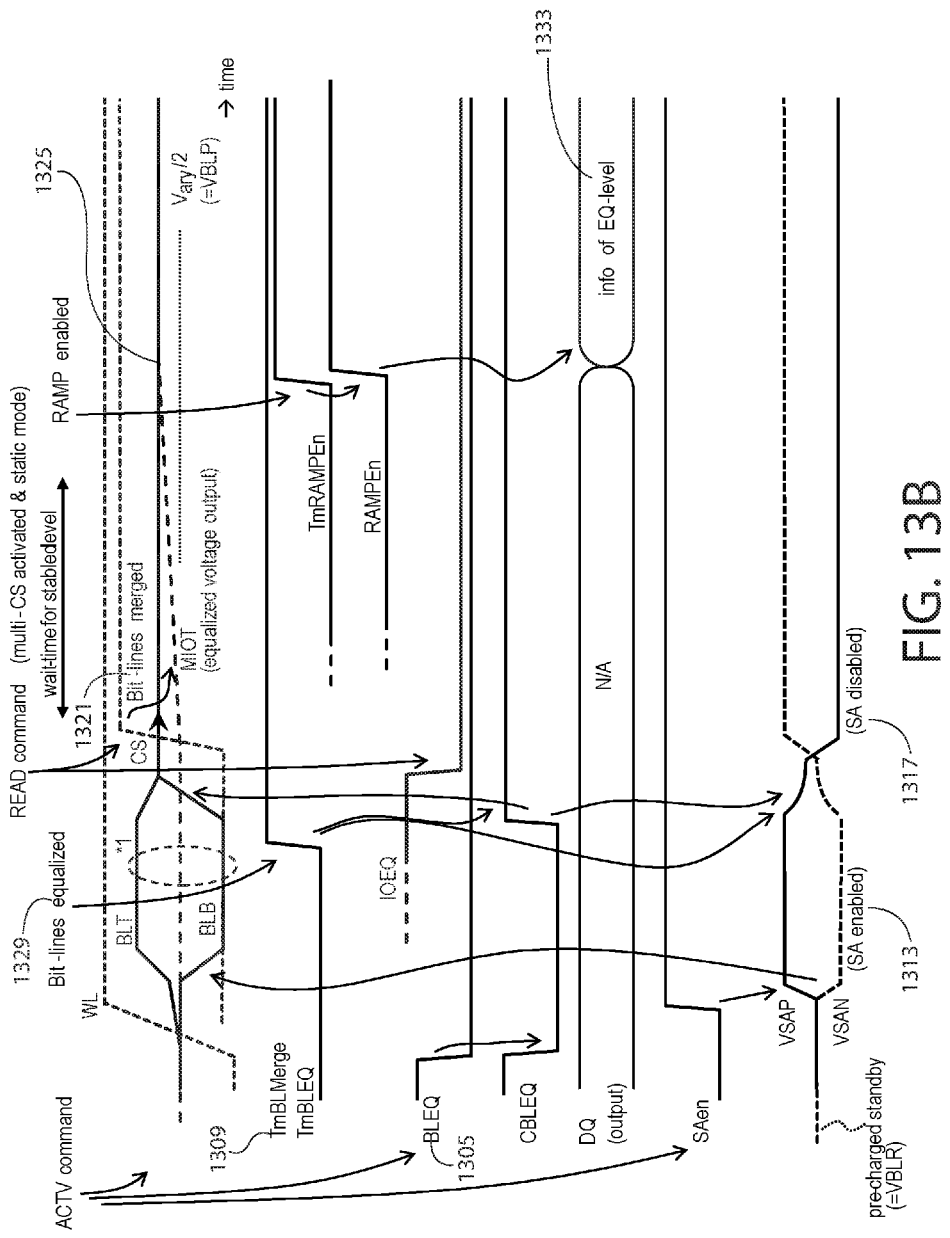
FIG. 13B is an additional timing diagram that shows various signal traces that illustrate an equalization level check for a memory device in accordance with the present disclosure.

FIG. 13A is a flow chart 1300 that illustrates a test-mode that executes a check of equalization levels in accordance with a second embodiment. The test mode illustrated in FIG. 13 may be executed using the tester 1202 illustrated in FIG. 12. The test-mode generally adjusts a load balance for bit-line pairs on the edge sense amplifier region by selecting the always activated word-lines in the edge array. As mentioned, "always activated" word-lines are activated during each memory access operation so as to balancing capacitance. The tester 1202 generally operates by finding a load balanced option by changing a number of activated word-lines in the edge array. More specifically, the tester loops through a set of test procedure steps until an optimal number of word-lines is found.

In operation 1304, the tester 1202 sets a proposed test-mode entry. The proposed test-mode entry generally corresponds to a particular combination of activated word-lines 132 in the reference array 108. On a first pass through the set of test procedure steps, the proposed test-mode entry may correspond to only one word-line 132 being asserted. On successive passes through the set of test procedure steps, additional word-lines 132 may be added such that progressively more word-lines 132 are included in the test-mode entry. For example, one word-line 132 may be activated on the first pass, two word-lines 132 may be activated on the second pass, three word-lines 132 may be activated on the third pass, and so on. As mentioned, particular combinations of word-lines 132 may be activated via the test mode option signal 1248. Thus, in operation 1304, the tester 1202 asserts an appropriate combination of signals on the test mode option signal 1248 depending on the number of passes through the test mode procedure that have taken place so far. Based on this signal, the appropriate number of word-lines 132 in the reference array 108 are activated via the operation of the reference array word decoder 116a.

In operation 1308, the tester 1202 activates one word-line 132 in the adjacent storage array 104. In so doing, the tester 1202 prepares the storage array 104 for a write operation on the activated word-line 132. The tester 1202 may provide an appropriate control signal to the storage array word decoder 116b. Based on the input control signal, the storage array word decoder 116b may assert the desired word-line 132 in the storage array 104. With the desired word-line asserted 132, the various memory cells on the word-line 132 couple to the word-line through the operation of an access transistor as described in connection with FIGS. 1A-C. With the memory cells so coupled, the storage array 104 is prepared for a write operation on the activated word-line 132.

In operation 1312, the tester 1202 writes the same data for all column addresses in the storage array 104. More specifically, the tester 1202 asserts the same data on all of the bit-lines 168 in the storage array 104. This memory write operation may be executed via the bit decoder discussed above in connection with FIGS. 1A-C. In one embodiment, the tester 1202 executes the memory write through an appropriate memory operation such as a Y-scan operation or the like. Additionally, in operation 1312, the tester 1202 turns off the VBLP power supply 216. As mentioned, this may be achieved by de-asserting the power amplifier enable signal 1252. With the VBLP power supply 216 turned-off, the reference side of the sense amplifiers 1216 sets to the reversed data and VBLP's source-line (VBLsr) sets to floating Vary/2.

In operation 1316, the tester 1202 executes the proposed test-mode entry by asserting the bit-line merge signal 1260. While keeping the word-lines active, the tester 1202 asserts the bit-line equalization signal 1256 to short/merge multi bit-lines 172 in the reference array 108 with bit-lines 168 in the storage array 104. The shorted bit-lines are then prepared for output through the transfer gate 1268 to the RWAMP circuits 1288.

In operation 1320, the tester 1202 executes a read operation after switching the input of the RWAMP circuits 1288 from the normal read circuits to the test circuits. Specifically, in test mode, the transfer gate 1268 associated with the reference array 108, when enabled through the AND gate 1272, passes bundled test data output from the reference array 108. In executing the read operation, output is provided to the DQ pad as part of the normal read out path. In some cases, the tester 1302 may execute a delay prior providing the output signal on the global bit-line in order to allow the output signal levels to stabilize. For example, the tester 1202 may wait a few micro seconds for signal levels to stabilize.

In operation 1324, the tester 1202 may determine if additional testing is required. More specifically, the tester 1302 may determine if an additional pass through the set of test procedure steps is needed. This determination may be based on whether or not a change in output signal is detected. A change in the output signal may occur when the output swings from either high to low or from low to high. When either of these two transistors occurs, it may be may be determined that the capacitance on the bit-lines 168, 172 is substantially balanced. At this point, the optimal number of always activated word-lines is determined.

If additional testing is required, operation 1328 follows operation 1324. In operation 1328, the tester 1202 sets a new proposed test mode entry option for the test mode option signal 1248. Operation 1304 follows operation 1328 such that the test flow is repeated with the new test mode entry option. If no additional testing is required, operation 1332 follows operation 1324. In operation 1332, the tester ends the test flow.

Figure 14:
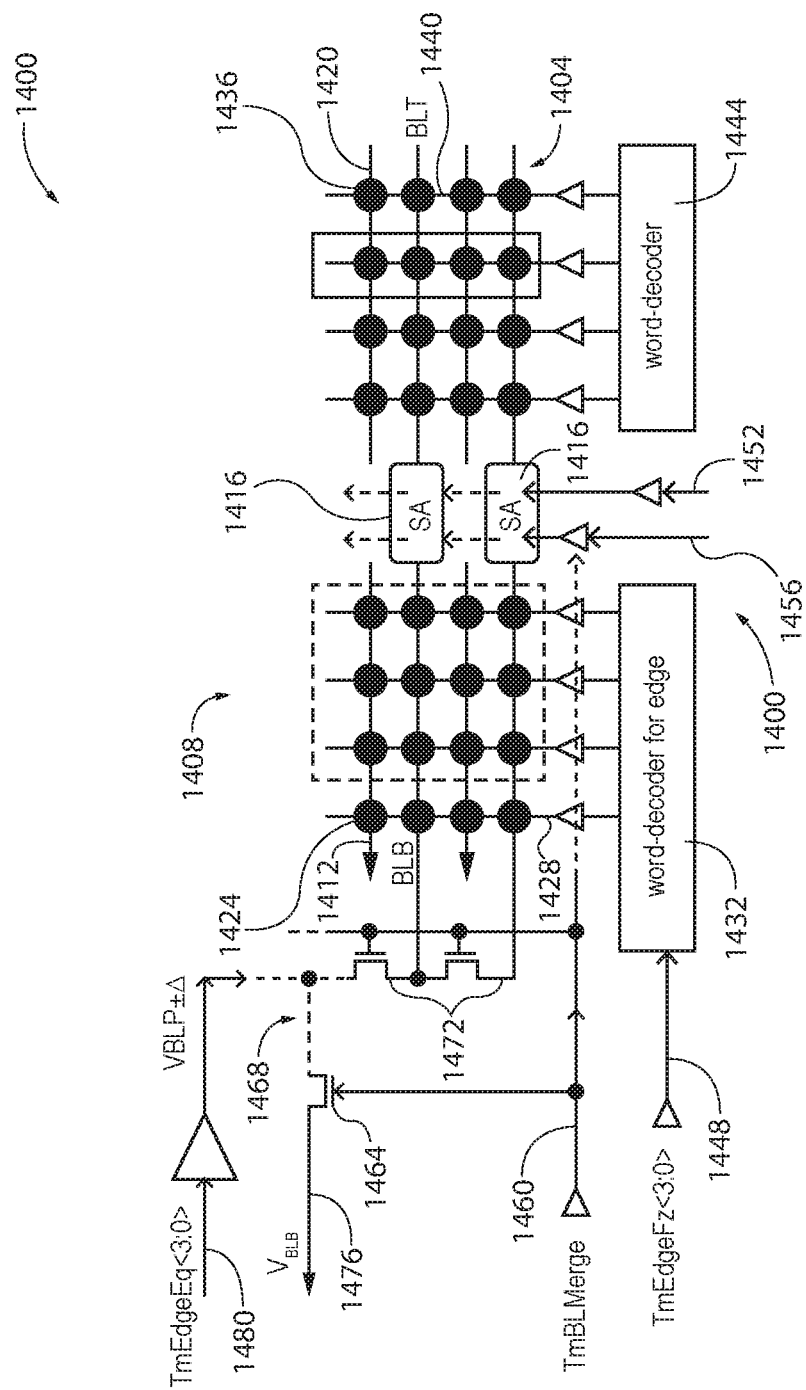
FIG. 14 is a schematic illustration of a tester embodiment for a memory device in accordance with the present disclosure.

FIG. 14 is an illustration a tester embodiment 1402 for a memory device 1400 in accordance with the present disclosure. The tester 1402 may be used for sense amplifier offset checking in a memory device 1400 in accordance with the present disclosure. FIG. 15B is a timing diagram that shows various signal traces that illustrate the sense amplifier offset checking for the example memory device 1400. As mentioned in connection with operation 916 above, a sense amplifier offset check may be executed so as to reject defective word-lines. In some implementations, a sense amplifier offset check may reject defective word-lines in combination with a functional test, DC test, and so on.

As described in greater detail in connection with FIG. 1, a memory device embodiment 1400 may include a storage array 1404 and a reference array 1408. Bit-line segments 1412 in the reference array 1408 couple to first sides of sense amplifiers 1416. Bit-line segments 1420 in the storage array 1404 couple to second sides of the sense amplifiers 1416. Reference array memory cells 1424 are disposed at the intersection of the reference array bit-line segments 1412 and reference array word-lines 1428. A reference array word decoder 1432 is configured to selectively activate and de-activate the reference array word-lines 1428. Storage array memory cells 1436 are disposed at the intersection of the storage array bit-line segments 1420 and storage array word-lines 1440. A storage array word decoder 1444 is configured to selectively activate and de-activate the storage array word-lines 1436.

The tester 1402 may include a test mode option signal (TmEdgeFz) 1448, a power amplifier enable signal (VBLsr) 1452, an equalization signal (BLEQf) 1456, and a bit-line merge signal (TmBLMerge) 1460 (See reference number 1505 in FIG. 15B). As described in more detail in connection with FIG. 1C and FIG. 10, the test mode option signal (TmEdgeFz) 1448 is coupled to a word decoder 1432 associated with the reference array 1408 and is configured to drive the word decoder 1432 with various test mode inputs. The power amplifier enable signal (VBLsr) 1452 is configured to enable (See reference number 1509 in FIG. 15B) and disable (See reference number 1513 in FIG. 15B) a power amplifier associated with the sense amplifiers 1416. The equalization signal (BLEQf) 1456 is configured to enable an equalization function of the sense amplifiers 1416.

The tester 1402 may also include a bit-line merge signal (TmBLMerge) 1460 that is configured to enable various components that together merge (See reference number 1517 in FIG. 15B) and provide output (See reference number 1521 in FIG. 15B) from a number of bit-line segments. Here, the bit-line merge signal 1460 may be configured to gate the equalization signal 1456 such that the bit-line merge signal 1460 may be asserted to pass the equalization signal 1456 to the sense amplifiers 1416. The bit-line merge 1460 may also be coupled to the gate of an output transistor 1464, which is a component of an transistor edge network 1468. In addition to the output transistor 1464, the edge network 1468 includes a plurality of bit-line transistors 1472. Each of the bit-line transistors 1472 is connected to one of the reference array bit-lines segments 1412. The bit-line transistors 1472 are connected in series such that they are connected at one end to the output transistor 1464. The bit-line merge signal 1460 provides the gate signal (See reference number 1525 in FIG. 15B) for each of the output transistors 1464. Through this configuration, the edge network 1468 may be generally configured to receive merged bit-line output and to further merge that input into a bundled output signal 1476. More specifically, the bit-line transistors 1472 receive merged bit-line output from each bit-line in the reference array 1408 and, when enabled by the bit-line merge signal 1460, join those outputs together into a bundled output 1476 that is output by the output transistor 1464.

As shown in FIG. 14, a tester may additionally include an edge equalization signal (TmEdgeEq) 1480. The edge equalization signal 1480 is coupled to a first end of the transistor edge network 1468. The edge equalization signal 1480 is generally configured to provide a voltage that differs by a small amount from the VBLP voltage associated with the sense amplifier 1416. The edge equalization signal 1480 may include inputs that specify the amount by which the edge equalization signal 1480 differs from the VBLP voltage. As described below, the tester 1402 may assert a voltage with a range defined by VBLP±Δ so as to produce a responsive output that indicates a location of defective word or bit-lines in the memory device 1400.

Figure 15A:
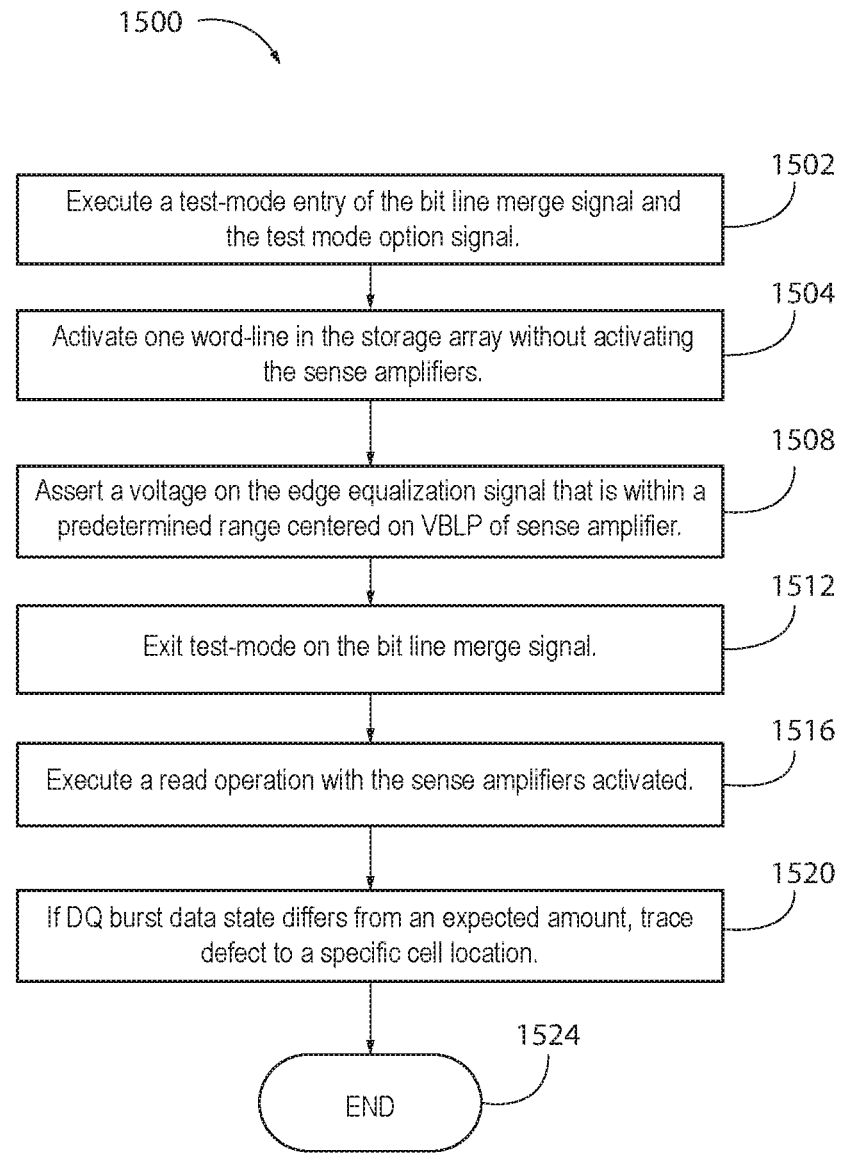
FIG. 15A is a flow chart that illustrates a test-mode that executes a sense amplifier offset check in accordance with an embodiment.
Figure 15B:
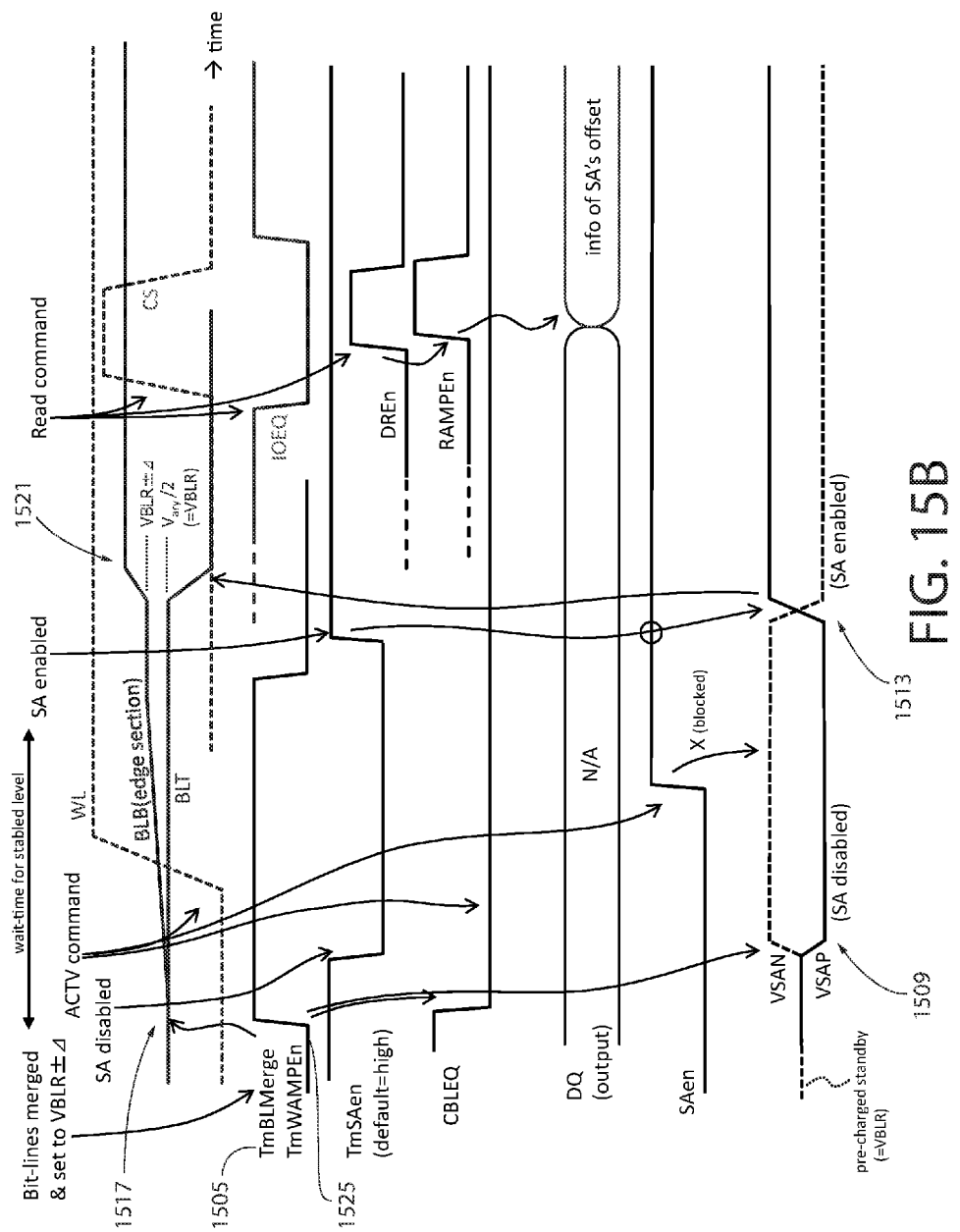
FIG. 15B is a timing diagram that shows various signal traces that illustrate the sense amplifier offset checking for a memory device in accordance with the present disclosure.

FIG. 15A is a flow chart 1500 that illustrates a test-mode that executes a sense amplifier offset check in accordance with an embodiment. The test mode illustrated in FIG. 15 may be executed using the tester 1402 illustrated in FIG. 14. The test-mode generally operates to reject defective dummy write lines and bits lines through sense amplifier offset checking in an edge reference array 1408 in accordance with the present disclosure.

In operation 1502, the tester 1402 executes a test-mode entry of the bit-line merge signal 1460 and the test mode option signal 1448 signals as described above. Operation 1502 includes determining the optimal number word-lines by the gross testing described above in connection with FIG. 10-13.

In operation 1504, the tester 1402 activates one word-line 1440 in the storage array 1404. The tester may activate the word-line without activating the sense amplifiers 1416. Specifically, the tester 1402 drives the storage array word decoder 1444 with an input signal that selects a particular word-line 1440. At the same time, the power amplifier enable signal 1452 is de-asserted so as to disable the power amplifier associated with the sense amplifier 1416.

In operation 1508, the tester 1402 changes the voltage level on the reference array 1408 memory cells once the sense-amplifier-deactivated word-line activation of operation 1408 is completed. Here, the tester 1302 asserts a voltage on the edge equalization signal 1480, where the asserted voltage is within a predetermined range that is centered on the voltage (VBLP) of sense amplifier 1416. That voltage may be indicated herein as VBLP±Δ. By asserting the voltage on the edge equalization signal 1480, the voltage is provided to the reference array 1480. Providing the voltage to the reference array 1408 produces an output that is determined by the amount which the voltage differs from the base level of VBLP. For example if Δ=+~mv the output data may be expected to be '0.' If Δ=−~mv the output data may be expected to be '1.'

In operation 1512, the tester 1402 exits test-mode on the bit-line merge signal 1460. Specifically, the tester 1402 de-asserts the test merge signal 1460 such that voltage is no longer shared between the reference array 1408 and the storage array 1404.

In operation 1516, the tester 1402 executes a read operation with the sense amplifiers 1416 activated. In one example, the tester 1402 executes a read operation with all column addresses activated, such as through a Y-scan operation or the like. The tester 1402 then outputs the result on the normal read out path.

In operation 1520, the tester 1402 checks the DQ burst data. If the DQ burst data state differs from an expected amount, the tester 1302 may trace the defect to a specific cell location. The defective cell may then be replaced with a redundancy dummy cell. In some embodiments, a similar test may be done with plate-bump test and so. However, this proposed test can be avoided based on other factors that vary a signal amount. In operation 1524, the tester 1402 ends the test flow.

Figure 16A:
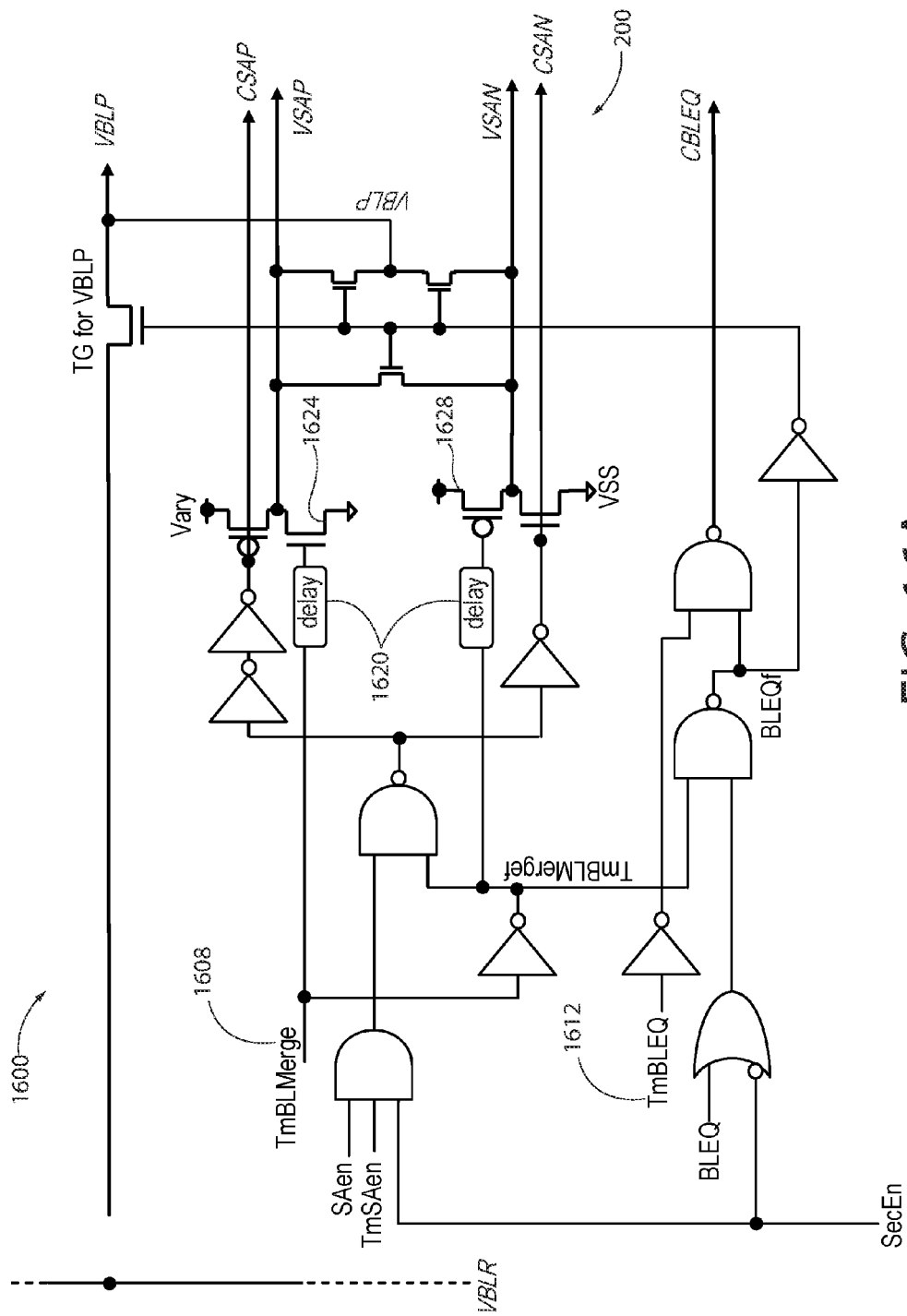
FIGS. 16A-B are diagrams for example sense amplifier controllers in accordance with the present disclosure.
Figure 16B:
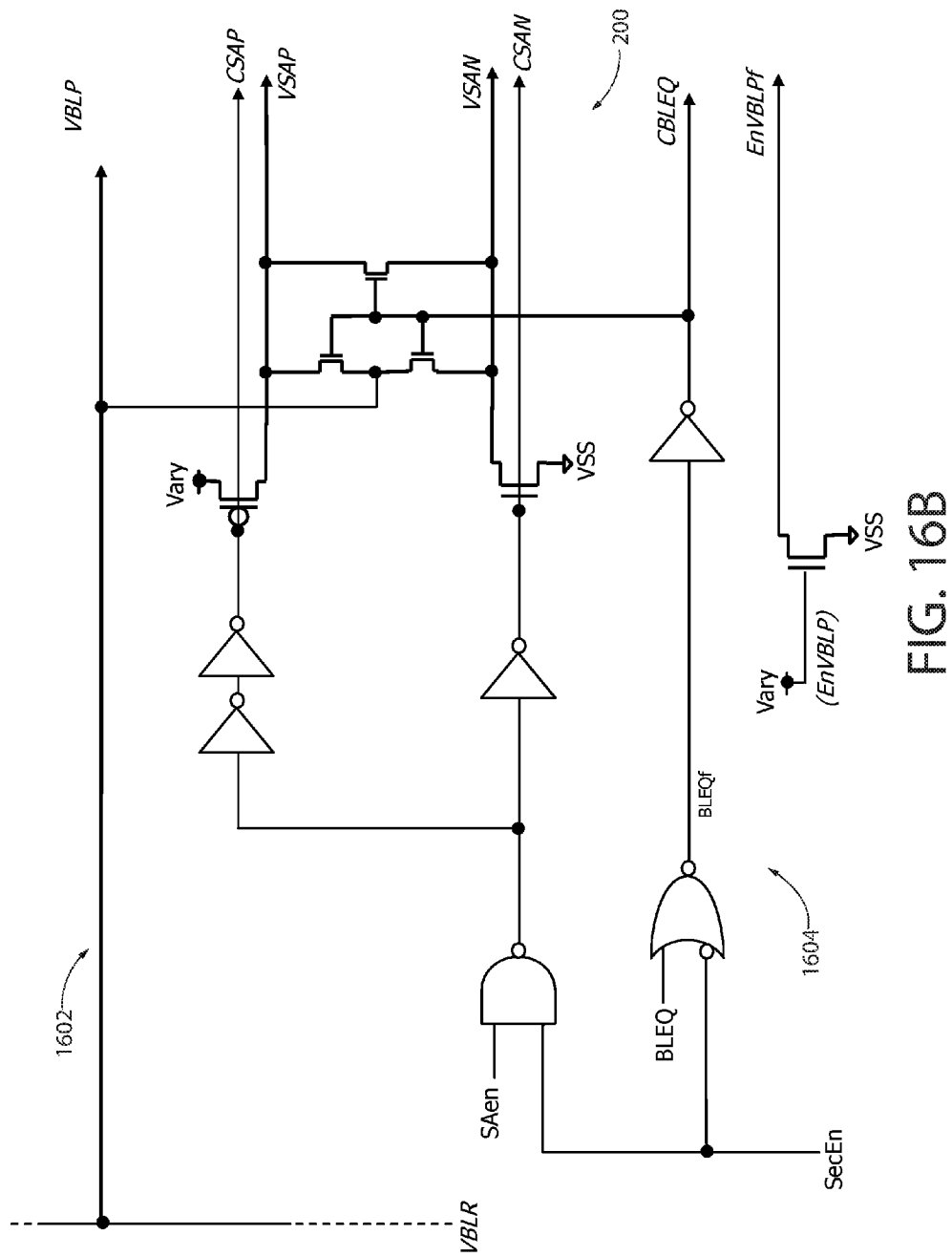

FIGS. 16A-B are diagrams for example sense amplifier controllers in accordance with the present disclosure. FIG. 16A is a circuit diagram for an example sense amplifier controller 1600 that may be used in connection with a reference memory array 108 in accordance with the present disclosure. FIG. 16B is a circuit diagram for an example sense amplifier controller 1602 that may be used in connection with a storage memory array 104 in accordance with the present disclosure. Both of the example controllers 1600, 1602 are shown coupled to portions of an example sense amplifier circuit, which is shown in greater detail in connection with FIG. 2. The circuit of FIG. 16B illustrates a coupling of various control signals through a gate network 1604 to transistors of the sense amplifier circuit 200. The circuit of FIG. 16A illustrates similar couplings and additional includes couplings for TmBLMerge 1608 and TmBLEQ 1612. As shown in FIG. 16A, the TmBLMerge 1608 and TmBLEQ 1612 may be coupled to gates of the sense amplifier circuit 200 through a gate network 1616 that includes a delay circuits 1620 coupled to the gates of additional sense amplifier transistors 1624, 1628.

Figure 17A:
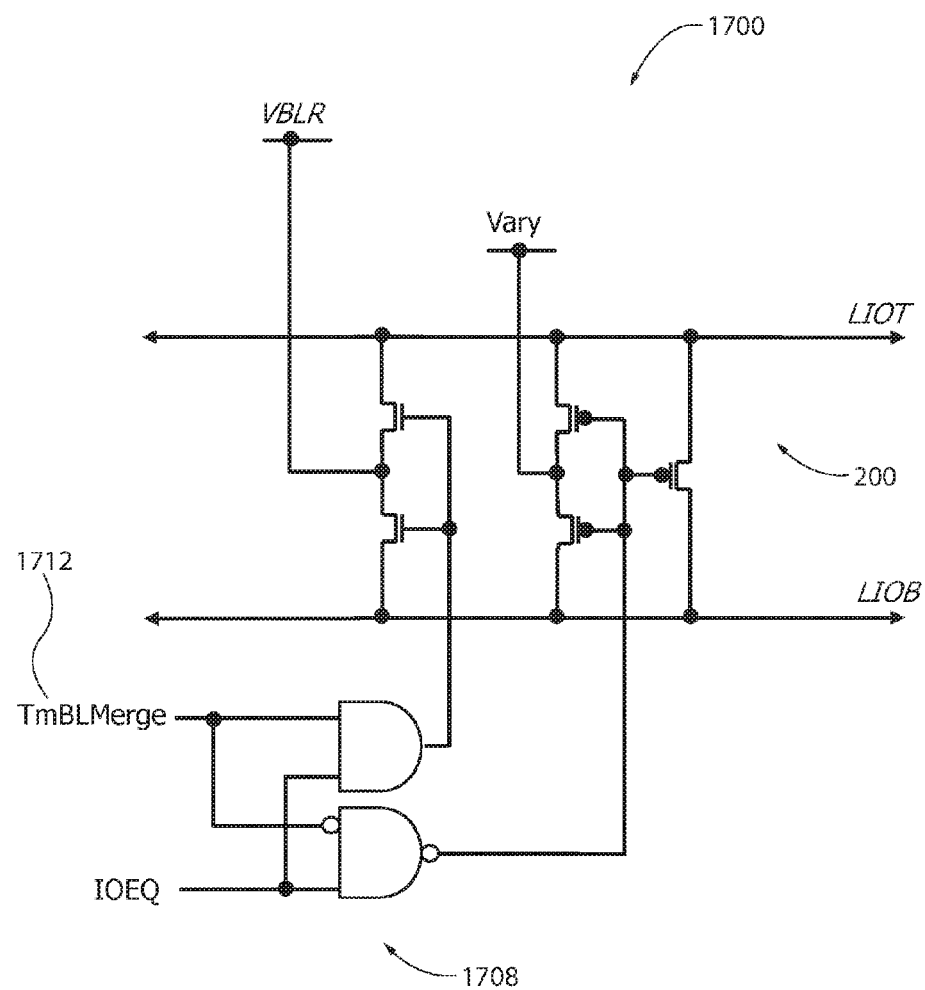
FIGS. 17A-B are diagrams for example LIO-EQ circuits in accordance with the present disclosure.
Figure 17B:
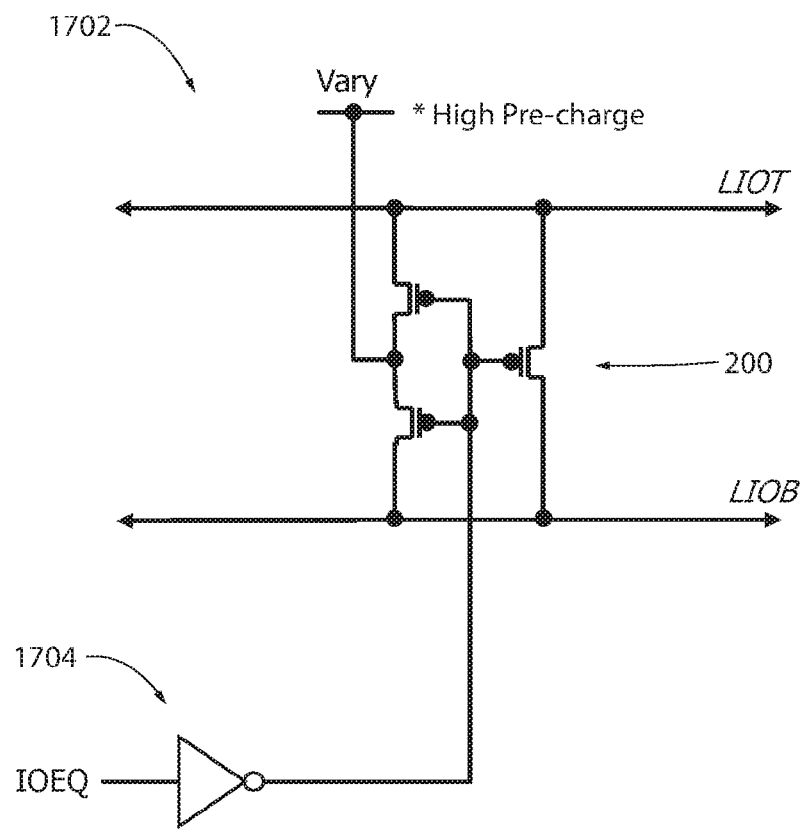

FIGS. 17A-B are diagrams for example LIO-EQ circuits in accordance with the present disclosure. FIG. 17A is a circuit diagram for an example LIO-EQ circuit 1700 for a reference memory array 108 that uses a normal data output path as shown in FIG. 12. FIG. 17B is a circuit diagram for an example LIO-EQ circuit 1702 for a storage memory array 104 that uses a normal data output path as shown in FIG. 12. Both of the LIO-EQ circuits 1700, 1702 are shown coupled to portions of an example sense amplifier circuit 200, which is shown in greater detail in connection with FIG. 2. The circuit of FIG. 17B illustrates a coupling of various control signals through a gate network 1704 to transistors of the sense amplifier circuit 200. The circuit of FIG. 17A illustrates a gate network 1708 that includes similar couplings and additionally includes couplings for TmBLMerge 1712.

Figure 18A:
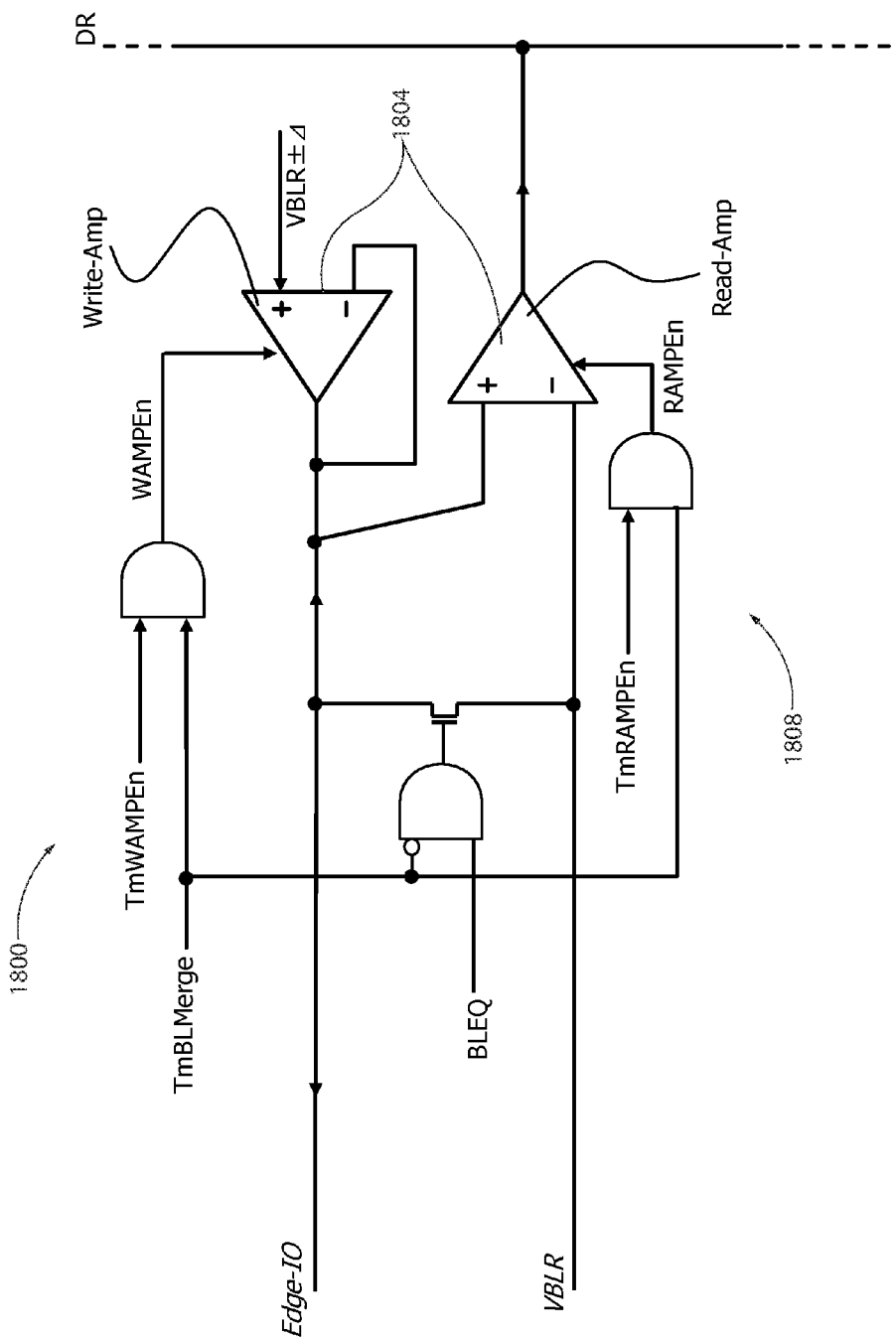
FIGS. 18A-B are diagrams for example RWAMP circuits in accordance with the present disclosure.
Figure 18B:
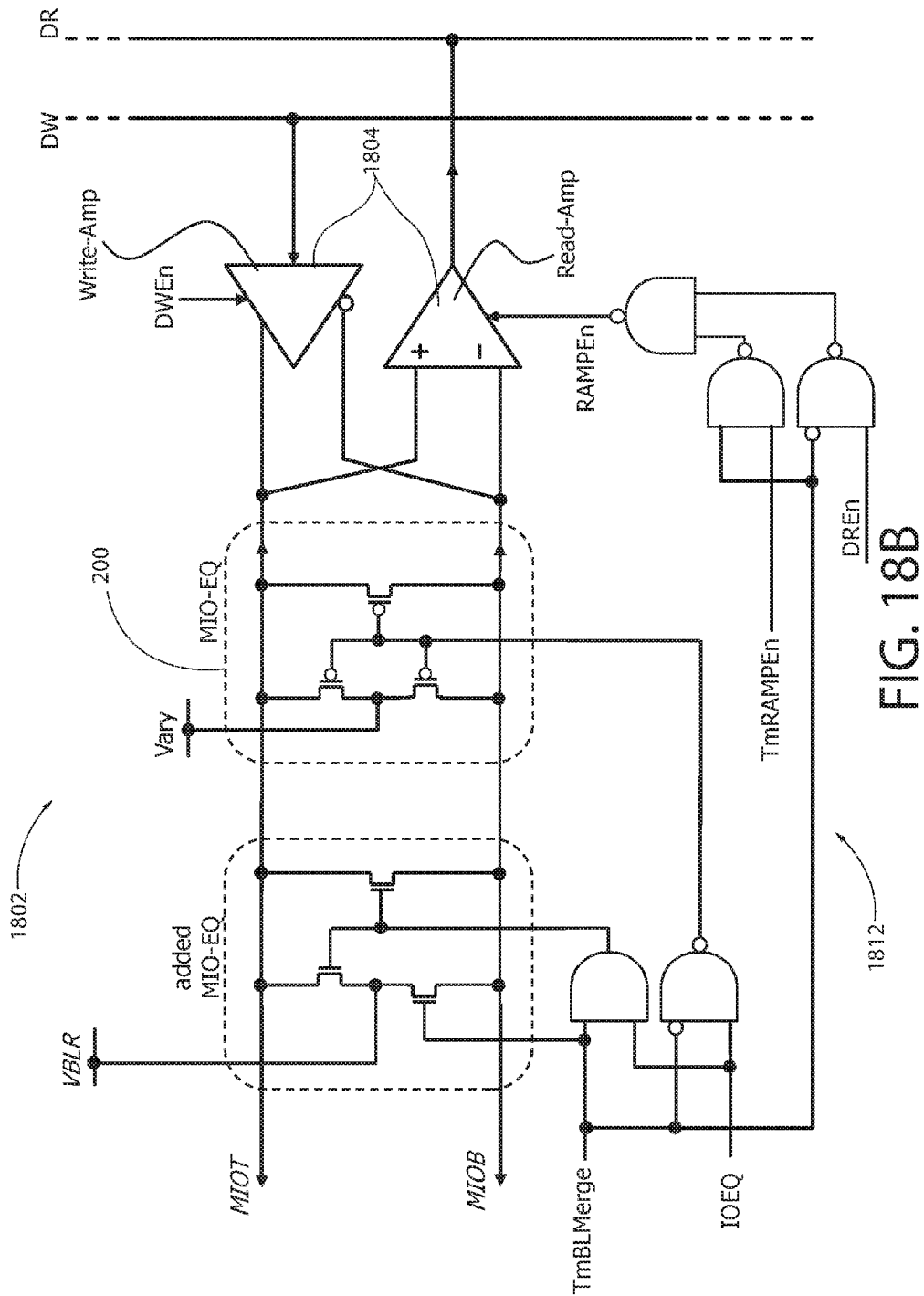

FIGS. 18A-B are diagrams for example RWAMP circuits in accordance with the present disclosure. FIG. 18A is a circuit diagram for an example RWAMP circuits 1800 that may be used in connection with a reference memory array 108 that provides EQ-level output via edge-RWAMP, such as shown in FIG. 1C or FIG. 10. FIG. 18B is a circuit diagram for example RWAMP circuits 1802 that may be used in connection with a reference memory array 108 that provides EQ-level output via a RWAMP associated with the normal data output path, such as shown in FIG. 12. Both of the example RWAMP circuits 1800, 1802 are shown coupled to read/write amplifiers 1804 used to read and write data across global data lines. The circuit of FIG. 18B illustrates a coupling of various control signals through a gate network 1808 to the read/write amplifiers 1804. The diagram of FIG. 18A illustrates a coupling of various control signals through a gate network 1812 to the read/write amplifiers 1804, as well as couplings to portions of a sense amplifier 200 (which is illustrated in greater detail in FIG. 2.

The various systems and methods disclosed herein have many advantages and benefits. A reference array in accordance with the present disclosure may reduce the area of an edge section in a memory array device. Reference array embodiments may also improve cell efficiency by using pseudo-load via a dummy Cell, Mos-cap, and so on. Using dummy memory cells and dummy word-lines as described herein can improve a sense amplifier operation margin by balancing complementary bit-lines in an optimal way. Using dummy memory cells in this manner provides for greater timing control and may involve a negligible area penalty. The various testing procedures described herein provide a manageable test flow that adjusts the edge load to match the real (inner) load of a bit-line. The testing procedures also provide an adjustable mechanism to reject defects in word and bit-lines. All these features are advantageous as future memory devices are designed with longer bit-line lengths and lowered operational voltages.

The above specification, examples and data provide a complete description of the structure and use of exemplary embodiments of the invention as defined in the claims. Although various embodiments of the claimed invention have been described above with a certain degree of particularity, or with reference to one or more individual embodiments, those skilled in the art could make numerous alterations to the disclosed embodiments without departing from the spirit or scope of the claimed invention. Other embodiments are therefore contemplated. It is intended that all matter contained in the above description and shown in the accompanying drawings shall be interpreted as illustrative only of particular embodiments and not limiting. Changes in detail or structure may be made without departing from the basic elements of the invention as defined in the following claims.

The foregoing description has broad application. The discussion of any embodiment is meant only to be explanatory and is not intended to suggest that the scope of the disclosure, including the claims, is limited to these examples. In other words, while illustrative embodiments of the disclosure have been described in detail herein, the inventive concepts may be otherwise variously embodied and employed, and the appended claims are intended to be construed to include such variations, except as limited by the prior art.

The invention claimed is:

1. A semiconductor device comprising:
   a first memory cell array comprising a first bit-line and a plurality of first memory cells connected to the first bit-line;
   a second memory cell array comprising a second bit-line and a plurality of second memory cells connected to the second bit-line, the number of second memory cells being smaller than that of the first memory cells;
   a sense amplifier connected to the first bit-line and a first end of the second bit-line;
   a word decoder configured to operate the second memory cells responsive to a first test signal;
   a transistor coupled to a second end of the second bit-line and operated by a second test signal; and
   a transistor edge network including a plurality of bit-line transistors each coupled to bit-lines in the second memory cell array, wherein the transistor is coupled to the second end of the second bit-line through at least one bit-line transistor of the transistor edge network.

2. The semiconductor device of claim 1, wherein the transistor edge network receives a merged bit-line output from each bit-line in the second memory cell array and joins the merged bit-line outputs together into a bundled output that is provided to the transistor.

3. The semiconductor device of claim 2, wherein the second test signal additionally operates to turns off a power supply in the sense amplifier which generates the merged bit-line outputs by enabling voltage sharing between the bit-lines of the first and second memory cell arrays.

4. The semiconductor device of claim 2, further comprising:
   a comparator having a first input coupled to the output transistor and a second input coupled to a reference voltage; wherein
   the comparator is configured to compare the bundled output provided by the transistor to the reference voltage and to provide a responsive output signal at a comparator output.

5. The semiconductor device of claim 4, wherein
   the responsive output signal includes one of two possible output states such that the particular output state provided by the comparator output at a particular time depends on a comparison of the first and second comparator inputs; and
   a transition between output states indicates that capacitance on the first and second bit-lines is substantially balanced.

6. The semiconductor device of claim 4, wherein
   the comparator output is used in a test mode that is executed to determine an activated word-line group for the second memory cell array; and
   the activated word-line group including at least some of a plurality of word-lines in the second memory cell array to be activated to support a balanced operation of the sense amplifier during a normal operation mode.

7. The semiconductor device of claim 6, wherein the test mode comprises:
   a first phase in which the comparator output is monitored to determine the activated word-line group based on a number of word-lines needed to provide a balanced operation of the sense amplifier; and
   a second phase in which defective word-lines in the activated word-line group are found and replaced with dummy word-lines.

8. The semiconductor device of claim 7, wherein the defective word-lines are determined through a variable voltage that is provided to the second memory array through the transistor edge network.

9. The semiconductor device of claim 6, wherein, in the normal operation mode, the second memory cell array couples the second memory cells in the activated word-line group to the second bit-line so as to balance a capacitance on the first bit-line during a memory access operation of at least one of the first memory cells.

10. The semiconductor device of claim 9, further comprising:
    at least one dummy word-lines in the first memory cell array that is asserted during a pre-charge phase to balance the capacitance of the memory cells of the activated word-line group.

11. The semiconductor device of claim 1, the second memory cell array is a reference array arranged at an edge of the semiconductor device.

12. The semiconductor device of claim 1, the second memory cell array is a reference array arranged between memory banks associated with the semiconductor device.

13. A semiconductor device comprising:
    a first memory cell array comprising a first bit-line and a plurality of first memory cells connected to the first bit-line;
    a second memory cell array comprising a second bit-line and a plurality of second memory cells connected to the second bit-line, the number of second memory cells being smaller than that of the first memory cells;
    a sense amplifier connected to the first bit-line and a first end of the second bit-line;
    a word decoder configured to operate the second memory cells responsive to a first test signal;
    first and second transistors operated by the first test signal to provide a test output signal through a normal read out pathway;
    a first multiplexer having a first input configured to receive a bundled output signal from the first and second transistors and having a second input coupled to a first global bit-line; and
    a second multiplexer having a first input coupled to a reference voltage and a second input coupled to a second global bit-line; and
    a global sense amplifier connected to outputs of the first and second multiplexers,
    wherein in a normal operation mode, the first and second multiplexers provide the first and second global bit-lines to the global sense amplifier as part of a memory access operation, and
    wherein in a test mode, the first multiplexer provides the bundled output signal and the second multiplexer provides the reference voltage to the global sense amplifier.

14. The semiconductor device of claim 13, wherein
    in a test mode, global sense amplifier compares the bundled output signal to the reference voltage provides a responsive output signal at a global sense amplifier output; and
    responsive output signal is used to determine an activated word-line group for the second memory cell array, the activated word-line group including at least some of a plurality of word-lines in the second memory cell array to be activated to support a balanced operation of the sense amplifier during a normal operation mode.

\* \* \* \* \*